(12) United States Patent
Gupta et al.

(10) Patent No.: US 7,383,529 B2
(45) Date of Patent: Jun. 3, 2008

(54) METHOD AND APPARATUS FOR DESIGNING CIRCUITS USING HIGH-LEVEL SYNTHESIS

(75) Inventors: Rajesh Kumar Gupta, San Diego, CA (US); Sumit Gupta, Mountain View, CA (US); Nikil Dutt, Irvine, CA (US); Alexandru Nicolau, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 299 days.

(21) Appl. No.: 11/057,416

(22) Filed: Feb. 14, 2005

(65) Prior Publication Data

US 2005/0193359 A1 Sep. 1, 2005

Related U.S. Application Data

(60) Provisional application No. 60/544,940, filed on Feb. 13, 2004.

(51) Int. Cl.
G06F 17/50 (2006.01)
(52) U.S. Cl. ...................................................... 716/18
(58) Field of Classification Search .................... 716/1, 716/3, 18
See application file for complete search history.

(56) References Cited

U.S. PATENT DOCUMENTS 6,493,863 B1 * 12/2002 Hamada et al. ............... 716/18
6,941,541 B2 * 9/2005 Snider .......................... 716/18
7,113,901 B1 * 9/2006 Schaumont et al. .......... 703/14

OTHER PUBLICATIONS

Lakshminarayana et al., "Fact: A Framework for the Application of Trhoughput And Power Optimizing Transformations to Control-Flow Intensive Behavioral Descriptions" DAC 98, Jun. 15-19, 1998, pp. 102-107.*
So et al., "Using Estimation From Beharioral Synthesis Tools in Compiler-Directed Design Space Exploration," ACM, Jun. 2-6, 2003, pp. 514-519.*
Varga et al., "Circuit Synthesis Based on VHDL Language Transformations," IEEE, 1999, pp. 225-228.*
M. Lam. Software pipelining: An effective scheduling technique for VLIW machines. PLDI, 1988.
A. Aiken, A. Nicolau, and S. Novack. Resource-constrained software pipelining. IEEE Transactions on Parallel and Distributed Systems, 6(12), Dec. 1995.
A. Nicolau and S. Novack. Trailblazing: A hierarchical approach to percolation scheduling. In International Conference on Parallel Processing, 1993.

(Continued)

*Primary Examiner*—Vuthe Siek
(74) *Attorney, Agent, or Firm*—Greer, Burns & Crain, Ltd

(57) ABSTRACT

A method for performing high-level synthesis (HLS) of a digital design includes a first phase for performing transformations on a behavioral description of the design, and a second phase for selecting a transformation from a plurality of transformations for transforming the behavioral description. The method further includes a third phase for implementing the transformed behavioral description using lower level primitives, and a fourth phase for generating implementation codes for the design.

8 Claims, 19 Drawing Sheets

OTHER PUBLICATIONS

E. Girczyc. Loop winding—a data flow approach to functional pipelining. Intl. Symp. of Circuits and Systems, 1987.

L.-F. Chao, A. S. LaPaugh, and E. H.-M. Sha. Rotation scheduling: A loop pipelining algorithm. DAC, 1993.

G. Goossens, J. Vandewlle, and H. De Man. Loop optimization in register-transfer scheduling for DSP-systems. In Design automation conference, 1989.

G. Lakshminarayana, A. Raghunathan, and N.K. Jha. Incorporating speculative execution into scheduling of controlflow intensive behavioral descriptions. DAC, 1998.

Lakshminarayana, G., Raghunathan, A., and Jha, N. 1999. Wavesched: A novel scheduling technique for control-flow intensive designs. IEEE Trans. CAD, 18, 505-523.

Girkar, M. and Polychronopoulos, C. 1992. Automatic extraction of functional parallelism from ordinary programs. IEEE Trans. Parall. Distrib. Syst. 3, 166-178.

Kountouris, A. and Wolinski, C. 1999. High level pre-synthesis optimization steps using hierarchical conditional dependency graphs. In Proceedings of the Euromicro Confernce. 1290-1294.

A.A. Kountouris and C. Wolinski. Efficient scheduling of conditional behaviors for high-level synthesis. Todaes, Jul. 2002.

Novack, S. and Nicolau, A. 1996. An efficient, global resource-directed approach to exploiting instruction-level parallelism. In Proceedings of the Conference on Parallel Architectures and Compilation Techniques. 87-96.

Pasko, R., Schaumont, P., Derudder, V., Vernalde, S., and Durackova, D. 1999. A new algorithm for elimination of common subexpressions. IEEE Trans. CAD, 18, 1 (Jan.), 58-68.

Potkonjak, M., Srivastava, M., and Chandrakasan, A. 1996. Multiple constant multiplications: Efficient and versatile framework and algorithms for exploring common subexpression elimination. IEEE Trans. CAD, 15, 2 (Mar.), 141-150.

Rim, M., Fann, Y., and Jain, R. 1995. Global scheduling with code-motions for high-level synthesis applications. IEEE Trans. VLSI Systems, 3, 379-392.

Wakabayashi, K. 1999. C-based synthesis experiences with a behavior synthesizer, "Cyber". In Proceedings of the Design, Automation and Test in Europe. 390-393.

Wakabayashi, K., and Tanaka, H.: Global scheduling independent of control dependencies based on condition vectors. Presented at Design Automation Conf., Anaheim, CA, Jun. 8-12, 1992.

dos Santos, L.C.V., and Jess, J.A.G.: A reordering technique for efficient code motion. Presented at Design Automation Conf., New Orleans, LA, Jun. 21-25, 1999.

dos Santos, L.C.V.: A method to control compensation code during global scheduling. Presented at Workshop on Circuits, Systems and Signal Processing, Mierlo, The Netherlands, Nov. 27-28, 1997.

P.Chou, R.Ortega, and G.Borriello. Interface co-synthesis techniques for embedded systems. In International Conference on Computer Aided Design, 1995.

J. Daveau, G.F. Marchioro, T. Ben-Ismail, and A.A. Jerraya. Protocol selection and interface generation for HW-SW Codesign. IEEE TVLSI, Mar. 1997.

M. Potkonjak and J. Rabaey. Optimizing resource utilization using transformations. IEEE Trans. on CAD, Mar. 1994.

I. Radivojevic and F. Brewer. A new symbolic technique for control-dependent scheduling. IEEE TCAD, Jan. 1996.

* cited by examiner

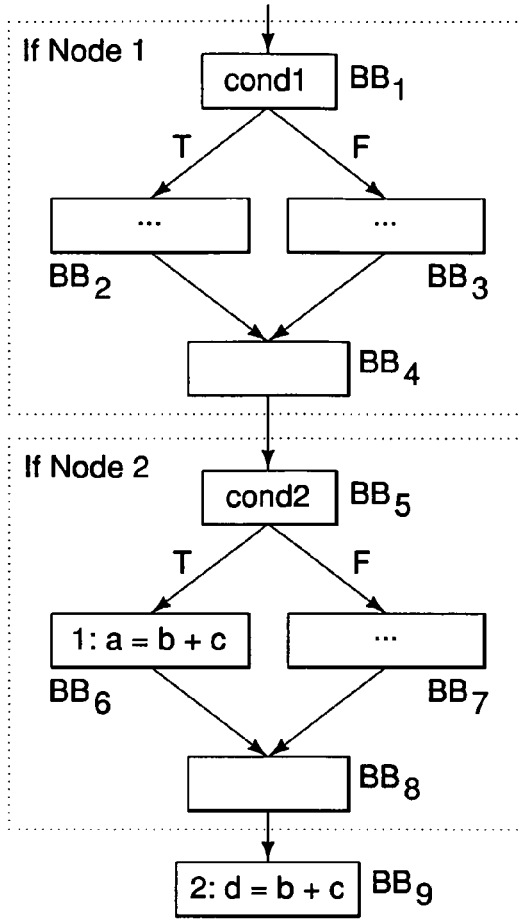 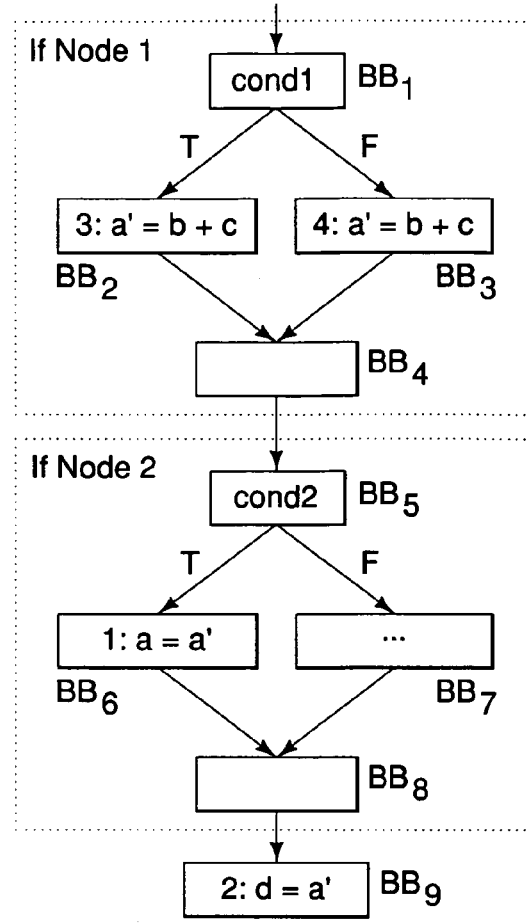
Figure 12(a)  Figure 12(b)
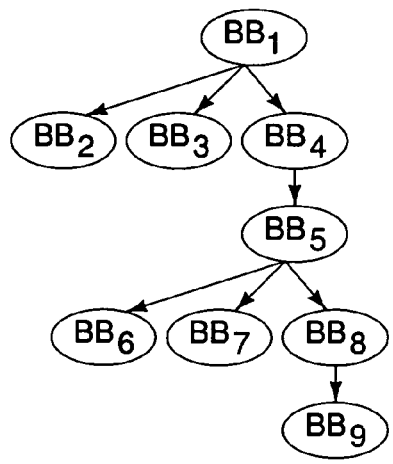
Figure 12(c)

METHOD AND APPARATUS FOR DESIGNING CIRCUITS USING HIGH-LEVEL SYNTHESIS

CLAIM FOR PRIORITY

This Application claims the benefit of U.S. Provisional Application No. 60/544,940 filed Feb. 13, 2004.

FIELD OF THE INVENTION

A field of the invention is circuit design generally. More specifically, the invention relates to digital circuit design using high-level synthesis (HLS).

BACKGROUND OF THE INVENTION

Driven by the increasing size and complexity of digital designs, there has been a renewed interest in high level synthesis of digital circuits from behavioral descriptions both in the industry and in academia. A key change that has taken place since high-level synthesis was first explored two decades ago is the widespread acceptance and use of register-transfer level (RTL) language modeling of digital designs. In fact, recent years have seen the use of variants of programming languages such as "C" and "C++" for behavioral level modeling. High-level synthesis and verification tools are essential for enabling widespread industrial adoption of these system-level programming paradigms.

However, there are several challenges that limit the utility and wider acceptance of high-level synthesis. There is a loss of control on the size and quality of the synthesized result. High-level languages allow for additional freedom in the way a behavior is described compared to register-transfer level descriptions. Thus, the style of high-level programming, in particular, the overall control flow and choice of control flow constructs, often has an unpredictable impact on the final circuit. Thus, we need techniques and tools that achieve the best code optimizations and synthesis results irrespective of the programming style used in the high level descriptions.

SUMMARY OF THE INVENTION

The present invention broadly relates to a method for performing high-level synthesis (HLS) of a digital design. The method includes a first phase for performing transformations on a behavioral description of the design, and a second phase for selecting a transformation from a plurality of transformations for transforming the behavioral description. The method further includes a third phase for implementing the transformed behavioral description using lower level primitives, and a fourth phase for generating implementation codes for the design.

BRIEF DESCRIPTION OF THE DRAWINGS

FIGS. 12(a)-12(c) illustrate a conditional speculation process on a sample HTG;

DETAILED DESCRIPTION OF THE PREFERRED EMBODIMENTS

Figure 1:
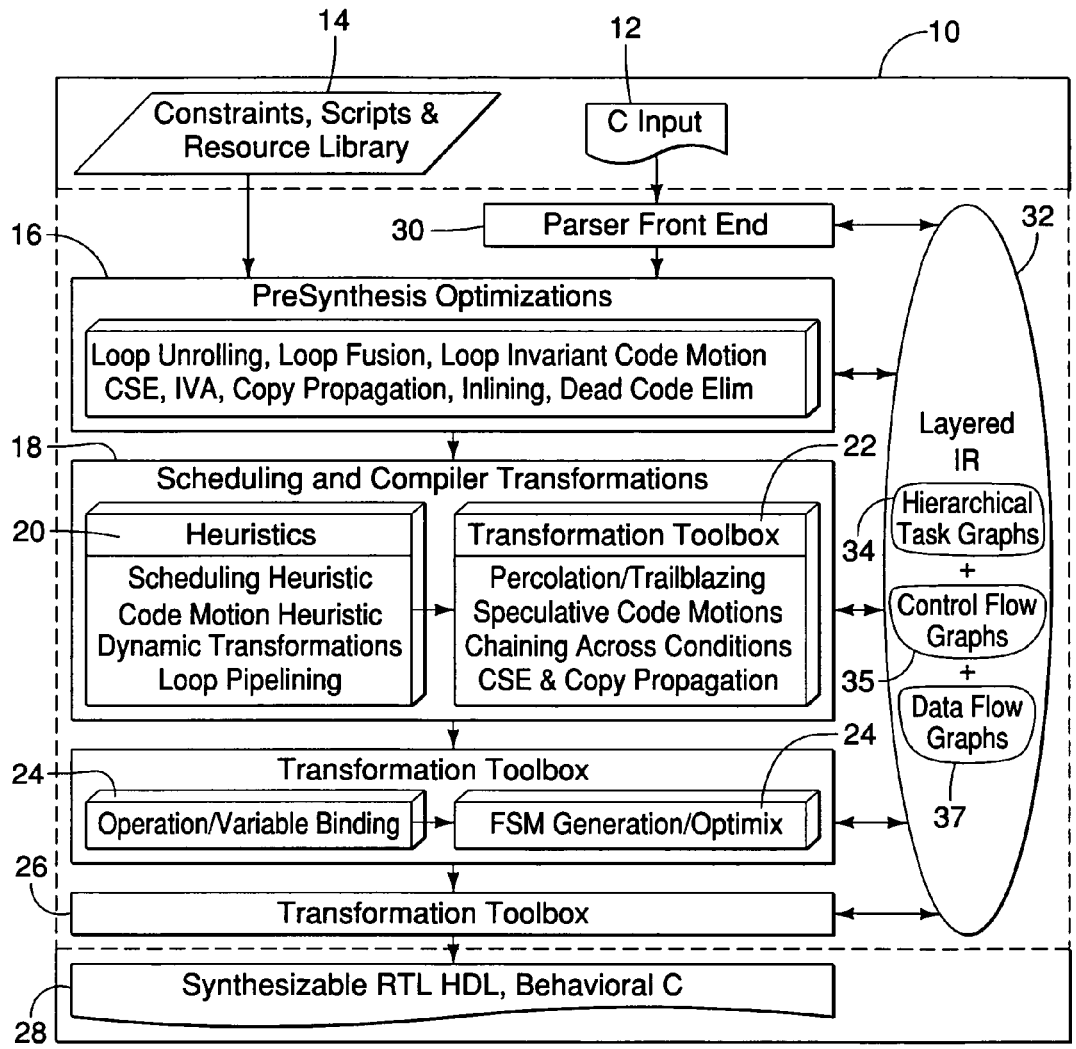
FIG. 1 shows the software architecture for a parallelizing high-level synthesis.

One embodiment of the invention relates to a parallelizing high-level synthesis methodology including a pre-synthesis phase that makes available a number of transformations to restructure a design description. These include transformations to reduce the number of operations executed such as common sub-expression elimination (CSE), copy propagation, dead code elimination and loop-invariant code motion. Also, we use coarse-level loop transformation techniques such as loop unrolling to increase the scope for applying parallelizing optimizations in the scheduling phase that follows. The scheduling phase employs a set of speculative, beyond-basic-block code motions that reduce the impact of the choice of control flow (various conditional and iteration constructs) on the quality of synthesis results. These code motions enable movement of operations through, beyond, and into conditionals with the objective of maximizing performance. Since these speculative code motions often re-order, speculate and duplicate operations, they create new opportunities to apply additional transformations "dynamically" during scheduling such as dynamic common sub-expression elimination. These compiler transformations are integrated with the standard high-level synthesis techniques such as resource sharing, scheduling on multi-cycle operations and operation chaining. Once a design has been scheduled, we use a resource binding and control generation pass, followed by a back-end code generator that can interface with standard logic synthesis tools to generate the gate level net-list.

Another embodiment of the present invention relates a high-level synthesis (HLS) framework, which has been designed to facilitate experimentation of the application of both coarse- grain and fine-grain code optimizations and view the effects of these transformations on the resultant VHDL code. The HLS framework of the present invention provides a toolbox of code transformations and supporting compiler transformations. The toolbox approach enables the designer to apply heuristics to drive selection and control of individual transformations under realistic cost models for high-level synthesis. The present invention is a high-level synthesis system that provides a path from an unstructured input behavioral description down to synthesizable RTL VHDL code. Using the present HLS framework, we have developed a set of speculative code motion transformations that enable movement of operations through, beyond, and into conditionals with the objective of maximizing performance. We have also developed dynamic transformations, such as dynamic CSE and dynamic copy propagation, that operate during scheduling to take advantage of change in the relative control flow between operations caused by the speculative code motions employed during scheduling.

Yet another embodiment of the present invention relates to algorithms for techniques that insert new scheduling steps dynamically during scheduling in the shorter of the two branches of a conditional block without increasing the longest path through the conditional. The new scheduling steps, together with idle resources in the basic block of the other conditional branch, can be used to schedule operations by conditional speculation. One technique inserts scheduling steps while traversing the design during scheduling, and another technique inserts steps to enable code motions (specifically conditional speculation). We call these techniques branch balancing during design traversal (BBDDT) and branch balancing during the code motions (BBDCM), respectively.

A further embodiment of the present invention is directed to a loop transformation, called loop shifting, that moves operations from one iteration of the loop body to its previous iteration. It does this by shifting a set of operations from the beginning of the loop body to the end of the loop body; a copy of these operations is also placed in the loop head or prologue. In contrast to loop pipelining techniques that initiate a new iteration of the loop body at constant time (initiation) intervals, loop shifting shifts a set of operations one at a time, thereby, exposing just as much parallelism as can be exploited by the available resources. Parallelizing transformations can then operate on the shifted operations to further compact the loop body.

Still further embodiment of the present invention is directed to interface synthesis approach that efficiently utilizes embedded RAMs in FPGAs to implement the memory. Our approach is based on a novel memory mapping algorithm that generates and optimizes a hardware interface used for integrating the computationally expensive application kernels (hardware assists) with the rest of the platform. Our memory mapping algorithm makes use of scheduling information on per cycle data access patterns (available from the high-level synthesis tool) in order to map registers to memories. The one feature of this algorithm is its ability to efficiently handle designs in which data access patterns are unknown during scheduling, for example, an array being indexed by variable indices which become known only at run-time. This feature proves to be extremely useful when dealing with designs involving control flow.

Turning now to FIG. 1, a parallelizing high-level synthesis (HLS) system 10 is described in accordance with the present invention. The HLS system 10 incorporates techniques derived from the compiler domain, particularly, from parallelizing compilers. We use these compiler techniques not only during the traditional scheduling phase of high-level synthesis, but also, during a pre-synthesis phase in which coarse-grain transformations are applied to the input description before performing high-level synthesis. As described below, the software components of the HLS system 10 are divided into four parts after the front-end. These parts are connected together by various data and command flows, including an Intermediate Representation (IR) that makes it possible to apply various transformations and optimizations on the target designs The HLS system takes a behavioral description, i.e., algorithmic description, in ANSI-C 12 as input and additional inputs in the form of a hardware resource library, resource and timing constraints and user directives 14 for the various heuristics and transformations. There are a few restrictions on the input C 12 dictated by the end goal to produce working hardware circuits. Each function in the input description is mapped to a (concurrent) hardware block. If one function calls another function, then the called function is instantiated as a component in the calling function. Switch statements are reduced to a series of if-then-else statements. The HLS system 10 support all types of loops such as do-while, repeat-until.

The transformations performed by the pre-synthesis part 16 in the pre-synthesis phase include (a) coarse-level code restructuring by function inlining and loop transformations (loop unrolling, loop fusion et cetera), (b) transformations that remove unnecessary and redundant operations such as common sub-expression elimination (CSE), copy propagation, and dead code elimination (c) transformations such as loop-invariant code motion, induction variable analysis (IVA) and operation strength reduction, that reduce the number of operations within loops and replace expensive operations (multiplications and divisions) with simpler operations (shifts, additions and subtractions).

The pre-synthesis phase is followed by the scheduling and allocation phase. In our current approach, we assume the designer has done the module selection and resource allocation and has available a hardware resource library that describes the type and number of each resource. Thereafter, a scheduler 18 in the scheduling and allocation phase does resource constrained scheduling. The scheduler 18 is organized into two parts: the heuristics 20 that perform scheduling and a toolbox 22 of synthesis and compiler transformations. This allows the heuristics 20 to employ the various transformations as and when required, thus enabling a modular approach that allows the easy development of new heuristics.

The synthesis transformations in the scheduler toolbox 22 include chaining operations across conditional blocks, scheduling on multi-cycle operations, and resource sharing. Besides the traditional high-level synthesis transformations, the scheduling phase also employs several compiler transformations applied "dynamically" during scheduling. These dynamic transformations are applied either to aid scheduling, such as speculative code motions, or to exploit the new opportunities created by scheduling decisions, such as dynamic CSE and dynamic copy propagation. Scheduling in HLS system 10 is done by a priority-based global list scheduling heuristic. This heuristic employs the transformations from the toolbox 22 and code motion techniques such as Trailblazing that efficiently move operations in designs with a mix of data and control flow.

The scheduling phase is followed by a resource binding and control generation phase. Given the increasing importance (and cost) of interconnect in high-performance CMOS chip designs, our resource binding part 24 aims to minimize the interconnect between functional units and registers. The control generation pass 24 generates a finite state machine (FSM) controller that implements the schedule. Finally, a back-end code generation pass 26 generates register-transfer level (RTL) VHDL 28 description of the circuit. This RTL VHDL 28 is synthesizable by commercial logic synthesis tools, hence, completing the design flow path from architectural design to the final design netlist. Several of the transformations from the pre-synthesis phase and the scheduling phase implemented in the HLS system 10 are discussed in the following sections. However, to enable the various coarse and fine-grain transformations employed by HLS system 10, we require an intermediate representation that maintains the structural information about the design, as explained below.

The HLS system 10 is a modular and extensible system that provides a number of code transformation techniques. The HLS system 10 has been designed to aid in experimenting with new transformations and heuristics that enhance the quality of synthesis results. The preferred input algorithmic or behavioral language for design descriptions is ANSI-C. This input description is parsed by a parser 30 (see FIG. 1) into a hierarchical intermediate representation described below.

One feature of the HLS system 10 is the transformations toolbox 22 that consists of a set of information gathering passes, basic code motion techniques and several compiler transformations. Passes from the toolbox 22 are called by a set of heuristics that guide how the code refinement takes place. Since the heuristics and the underlying transformations that they use are independent, heuristics can be easily tuned by calling different passes in the toolbox 22. As shown in FIG. 1, the transformations toolbox 22 contains a data dependency extraction pass, parallelizing code motion techniques, dynamic renaming of variables, the basic operations of loop (or software) pipelining and some supporting compiler passes such as copy and constant propagation and dead code elimination. The various passes and transformations can be controlled by the designer using scripts, hence, allowing experimentation with different transformations and heuristics. After scheduling, the HLS system 10 then does control synthesis and optimization. Control synthesis generates a finite state machine controller and also does resource binding. The back-end of the HLS system 10 then generates synthesizable RTL VHDL, for example. This enables the design methodologists to integrate the HLS system 10 into the standard synthesis oriented chip design flows.

The HLS system 10 stores the behavioral description in an intermediate representation (IR) that retains all the information given in the input description. This is enables source-level transformations, making global decisions about code motion and enables the visualization of intermediate results to improve user-interaction.

Figure 2A:
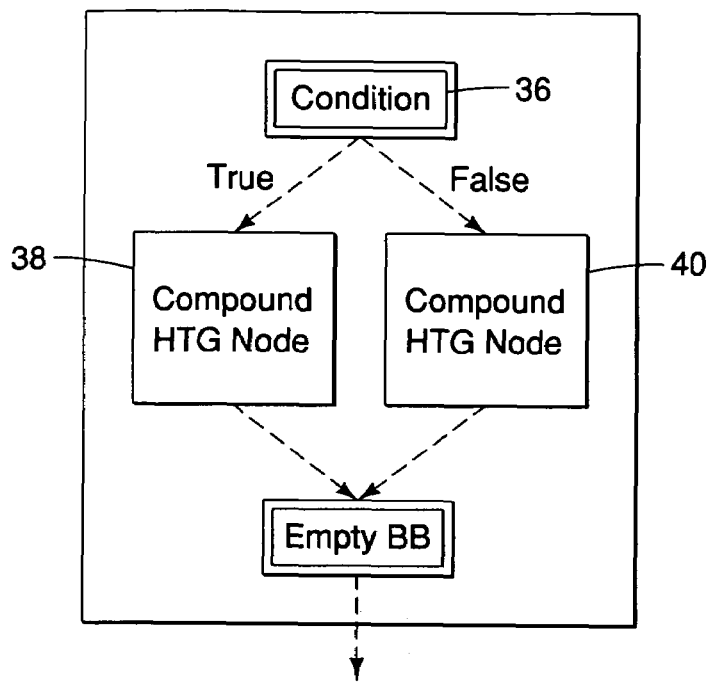
FIG. 2(a) is a hierarchical task graph (HTG) representation of an if-block.
Figure 2B:
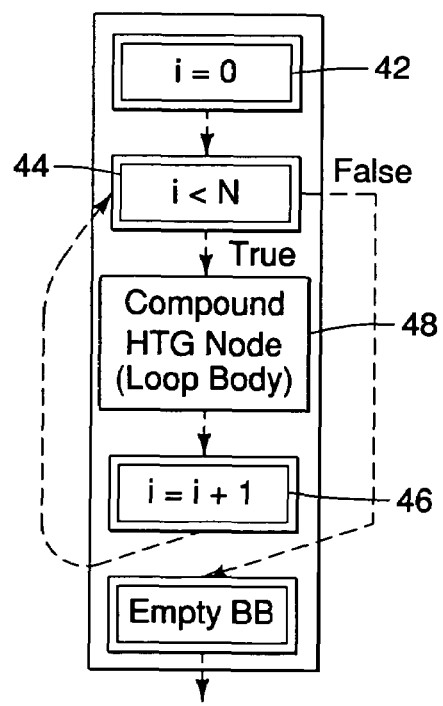
FIG. 2(b) is a hierarchical task graph (HTG) representation of a For-Loop.

The intermediate representation 32 used in HLS system 10 consists of basic blocks encapsulated in Hierarchical Task Graphs (HTGs) 34, control flow graphs 35, and data flow graphs 37. As known in the art, the control flow graphs 35 capture the flow of control between basic blocks, and the data flow graphs 37 capture the data dependencies between operations. The HTG 34 is a directed acyclic graph that has three types of nodes: single nodes (non-hierarchical nodes), compound nodes (nodes that have sub-nodes), and loop nodes. Operations that execute concurrently are aggregated together in single nodes called statements. Statements that have no control flow between them are aggregated together into basic blocks. Basic blocks are encapsulated into compound HTG nodes to form hierarchical structures such as if-then-else blocks, switch-case blocks, loop nodes or a series of HTG nodes. Expressions are stored as abstract syntax trees and each operation expression is initially encapsulated in a statement node of its own. FIG. 2(a) illustrates the HTG 34 for a if-then-else conditional block (the dashed edges indicate control flow). It consists of a basic block each for the condition 36 and for the join and compound HTG nodes 38, 40 for the true and false branches. Similarly, the conceptual representation of a For-loop HTG is shown in FIG. 2(b). A for-loop HTG consists of basic blocks for the initialization 42, the conditional check 44 and the loop index increment 46 (optional) and a compound HTG node 48 for the loop body. One feature of HTGs is that they are strongly connected components i.e., they have a single entry and a single exit point. This property enables HTGs 34 to be used to encapsulate complex loops and irregular regions of code, to regularize code motion techniques and reduce the amount of patch-up code inserted as explained next.

The code motion techniques implemented in the toolbox of the HLS system 10 are percolation scheduling and trailblazing. Percolation Scheduling (PS) was developed as a technique to target code to parallel architectures such as VLIWs and vector processors. Percolation scheduling compiles programs into parallel code by systematically applying semantic preserving transformations. These transformations have been proven to be complete with respect to the set of all possible local, dependency-preserving transformations on program trees.

However, to move an operation from a node A to node B, percolation requires a visit to each node on every control path from A to B. The incremental nature of these linear operation moves cause code explosion by unnecessarily duplicating operations and inserting copy operations. Trailblazing circumvents these problems.

Trailblazing is a code motion technique that exploits the hierarchical structuring of the input description's operations and global information in HTGs to make non-incremental operation moves without visiting every operation that is bypassed. At the lowest level, trailblazing is able to perform the same fine-grained transformations as percolation. However, at a higher level, trailblazing is able to move operations across large blocks of code.

Figure 3A:
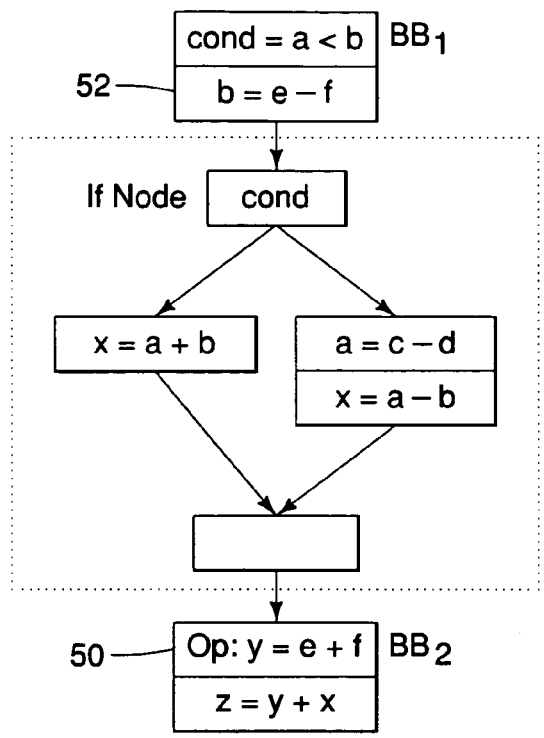
FIGS. 3(a)-3(b) show movement of a code fragment across a conditional branch.
Figure 3B:
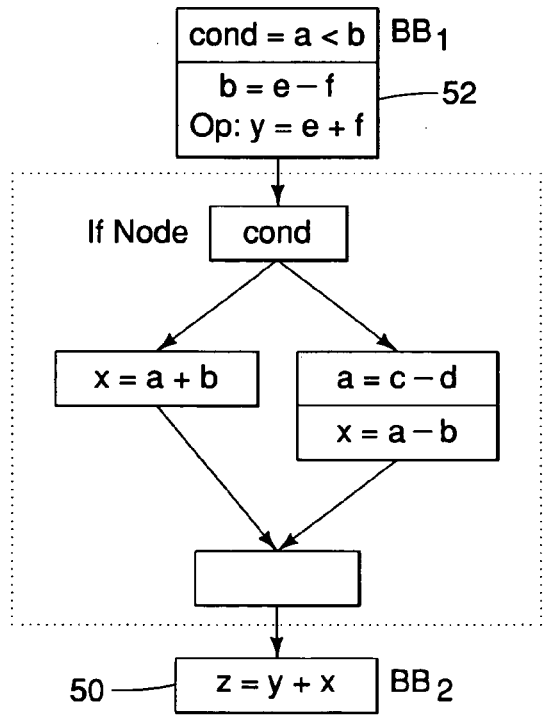

While an operation is being moved using trailblazing, the algorithm moves the operation across HTG nodes that it comes across if the moving operation has no dependencies with the HTG node. Hence, in the example in FIG. 3(a), the operation Op: y=e+f can be moved from basic block $BB_2$ 50 to $BB_1$ 52, across the if-then-else HTG node, since it has no data dependencies with any of the operations in this if-node. The resultant code is shown in FIG. 3(b). To perform the same code motion, percolation would have duplicated Op into both the branches of the if-block and visited each node in the if-block before finally unifying the copies at the conditional check.

There are four types of data dependencies: flow (variable read after write), anti (write after read), output (write after write) and input (read after read). The HLS system 10 retains the complete information about variables used in the input description in data dependency graphs that maintain all the data dependency types. This allows visualization of the intermediate results of transformations applied to the input description.

Figures 4A, 4B, 4C:
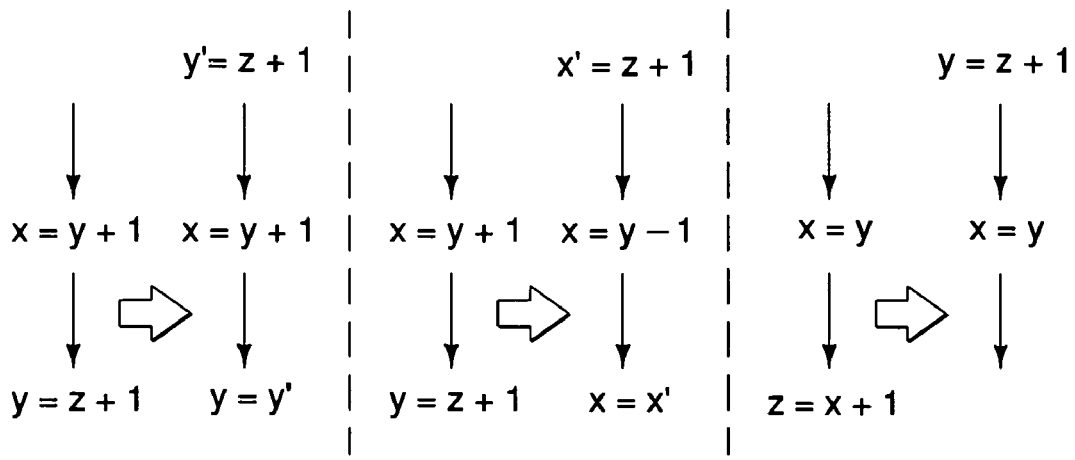
FIGS. 4(a)-4(c) show an operation for moving past another operation while dynamically eliminating the data dependencies.

However, non-flow dependencies that prevent code motions can often be resolved by dynamic renaming and combining. FIGS. 4(a) to (c) demonstrate how one operation can be moved past another one while dynamically eliminating data dependencies. In FIG. 4(a), an anti dependency can be resolved during scheduling by moving only the right hand side of the operation y=z+1. The result is written to a new destination variable y' and the original operation is replaced by the copy operation, y=y'. Similarly, in FIG. 4(b), an output dependency between two operations that write to the same variable x, can be resolved in a similar manner by creating a new destination variable x'. These copy operations introduced by dynamic renaming, can also be circumvented by a technique known as combining. Combining replaces the copy in the operation being moved by the variable being copied. This is demonstrated in FIG. 4(c), where the operation z=x+1 is moved past the copy operation x=y. The variable x is replaced with the variable y in the moving operation. Dynamic renaming and combining can lead to considerable easing of the constraints imposed by data dependencies and enable the set of speculative code motions discussed next to be more effective.

Figure 5:
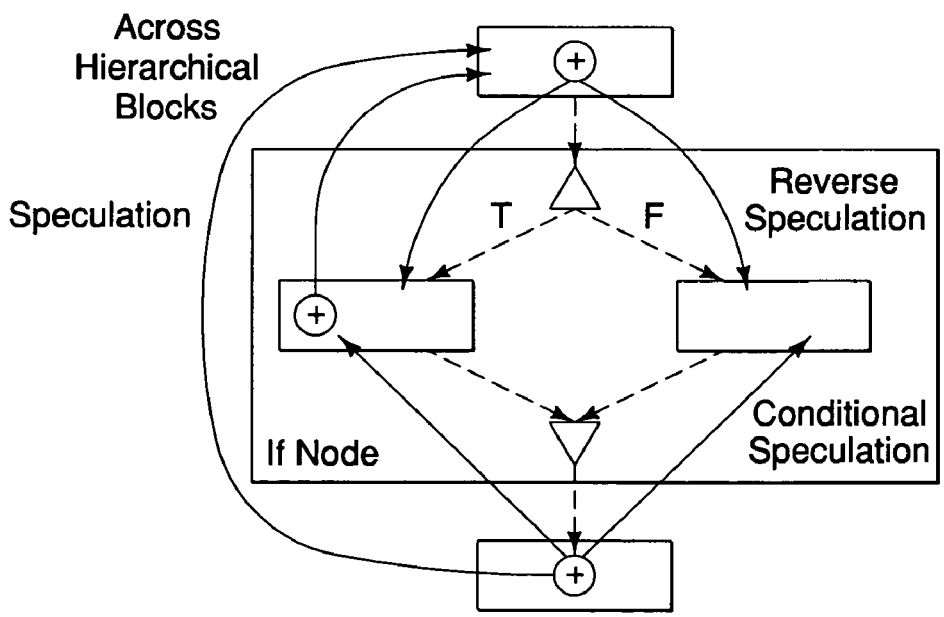
FIG. 5 shows an overview of various speculative code motions.

According to another embodiment of the invention an overview of the various speculative code motions is shown in FIG. 5. Operations may be moved out of conditionals and executed speculatively, or operations before conditionals may be moved into subsequent conditional blocks and executed conditionally by reverse speculation, or an operation from after the conditional block may be duplicated up into preceding conditional branches and executed conditionally by conditional speculation. Operations can also be moved across entire hierarchical blocks, such as if-then-else blocks or loops. Reverse speculation can be coupled with early condition execution that evaluates conditional checks as soon as possible. Since these code motions re-order, speculate and duplicate operations, they often create new opportunities for dynamically applying transformations such as common sub-expression elimination during scheduling as discussed next.

Common sub-expression elimination (CSE) is a known transformation that attempts to detect repeating sub expressions in a piece of code, stores them in a variable and reuses the variable wherever the sub-expression occurs subsequently. Hence, for the example in FIG. 6(a), the common sub-expression b+c in operation 2 can be replaced with the result of operation 1, as shown in FIG. 6(b).

Figure 6A:
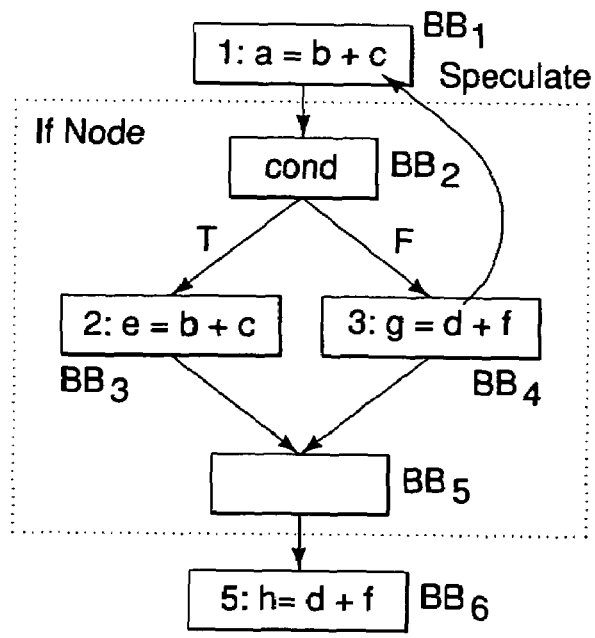
FIGS. 6(a)-6(b) illustrate dynamic common sub-expression elimination (CSE) on a sample HTG.
Figure 6B:
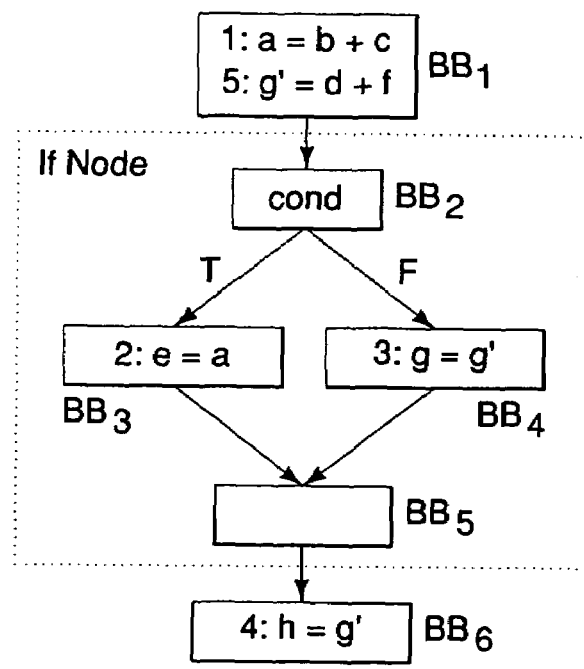

Now consider that for the example in FIG. 6(a), the scheduling heuristic decides to schedule operation 3 in $BB_1$ and execute it speculatively as operation 5, as shown in FIG. 6(b). The result of the speculated operation 5 can then be used to replace the common sub-expression in operation 4 as shown in FIG. 6(b). Hence, to exploit these new opportunities created by speculative code motions, CSE has to be applied during scheduling rather than the traditional approach of applying it as a pass before scheduling. We call this new approach of applying CSE while scheduling an operation, Dynamic CSE. Conceptually, dynamic CSE finds and eliminates operations in the list of remaining ready-to-be-scheduled operations that have a common sub-expression with the currently scheduled operation. Applying CSE as a pass after scheduling is not as effective as dynamic CSE, since the resource freed up by eliminating an operation during scheduling can potentially be used to schedule another operation by the scheduler. Dynamic CSE has been shown to significantly improve synthesis results when applied with speculative code motions, particularly code motions such as reverse and conditional speculation that duplicate operations in the HTG.

The present invention also includes a scheduling heuristic that schedules the HTG of the design using the speculative code motions and the dynamic CSE transformation. This Priority-based Global List Scheduling heuristic is presented below.

```
Scheduling Heuristic with Dynamic CSE
    Inputs: Unscheduled HTG of design, Resource List R
    Output: Scheduled HTG of design
 1: Scheduling step step = 0
 2: while (step ≠ last step of HTG ) do
 3:      foreach (resource res in Resource List R) do
 4:         Get List of Available Operations A
 5:         Pick Operation op with lowest cost in A
 6:         Move op and schedule on res in step
 7:         ApplyDynamicCSE(op, A)
 8:      endforeach
 9:      step = step+1
10: endwhile
```

The inputs to this heuristic are the unscheduled HTG of the design and the list of resource constraints. Additionally, the designer may specify a list of allowed code motions, AllowedCMs (i.e. speculation, conditional speculation et cetera), whether dynamic variable renaming is allowed, and the code motion technique (percolation or trailblazing) for moving the operations. The heuristic starts by assigning a priority to each operation in the input description based on the length of the dependency chain of operations that depend on it.

Scheduling is done one control or scheduling step at a time while traversing the basic blocks in the design's HTG. Within a basic block, each scheduling step corresponds to a statement HTG node (see Section 4). At each scheduling step in the basic block, for each resource in the resource list, a list of available operations is collected, Available operations is a list of operations that can be scheduled on the given resource at the current scheduling step. Initially, all unscheduled operations in the HTG that can be scheduled on the current resource type are added to the available operations list. Subsequently, operations whose data dependencies are not satisfied and cannot be satisfied by dynamic variable renaming, and operations that cannot be moved in the HTG 34 to schedule them onto the current scheduling step using the allowed code motions, are removed from the available list. The remaining operations are assigned a cost based on the length of the dependency chain leading up to the operation.

The scheduling heuristic then picks the operation with the lowest cost from the available operations list as shown in line 5 of the above Algorithm 1. The code motion technique (trailblazing) is then instructed to schedule this operation at the current scheduling step. This is repeated for all resources in each scheduling step in the HTG 34. Once the chosen operation has been scheduled, the dynamic CSE heuristic finds and eliminates common sub-expressions in the operations in the available list, if the new position of the scheduled operation op permits.

In describing the present invention for inserting new scheduling step dynamically during scheduling, we use the following terminology. A scheduling step is an aggregation of operations that execute concurrently. A sequence of scheduling steps with no control flow between them is encapsulated in a basic block. We capture the control flow between basic blocks using a hierarchical intermediate representation called hierarchical task graphs (HTGs). HTGs model the design with three type of nodes: (a) single nodes that encapsulate basic blocks, (b) compound nodes that are hierarchical in nature and encapsulate conditional constructs such as if-then-else blocks and switch-case blocks, and (c) loop nodes that encapsulate for-loops, while-loops etc.

An example of hierarchical task graph representation of an if-then-else conditional construct is shown in FIG. 2(a). As described above, an if-then-else or If-HTG consists of the condition basic block 36, compound HTG nodes for the true and false branches and an empty basic block for the merge or join of the conditional branches. Similarly, the HTG representation of a For-loop is shown in FIG. 2(b). A For-HTG consists of the optional initialization basic block 42 (i=0), the condition check basic block 44 (i<N), the compound HTG node for the loop body 48, the optional increment basic block 46 (i=i+1), and an empty basic block for the loop exit. In this FIG., basic block $BB_1$ is the conditional basic block of the if-then-else (or If-HTG), $BB_2$ and $BB_3$ are the true and false branches respectively and $BB_4$ is the join basic block of the If-HTG (i.e. where the control flow in the If-HTG merges). This FIG. also shows the operations and the data flow between them. Also note that we say a resource is idle in a scheduling step when there is no operation scheduled on the resource in that scheduling step.

Generally, speculation refers to the unconditional execution of operations that were originally supposed to have executed conditionally. However, frequently there are situations in which there is a need to move operations into conditionals. This may be done by reverse speculation, where operations before conditionals are moved into subsequent conditional blocks and executed conditionally, or it may be done by conditional speculation, in which an operation from after the conditional block is duplicated up into preceding conditional branches and executed conditionally. Reverse speculation can be coupled with early condition execution in which conditional checks are evaluated as soon as possible, so that the operations in their branches do not have to be speculated for scheduling. The various speculative code motions are shown in FIG. 5. Also shown is the movement of operations across entire hierarchical blocks, such as if-then-else blocks or loops.

Figure 7A:
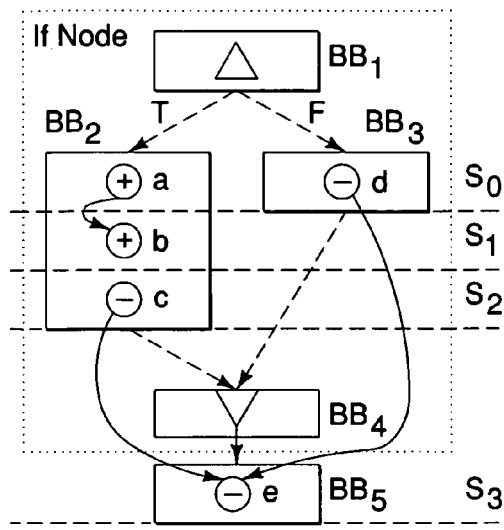
FIGS. 7(a)-7(c) illustrate a process for enabling new code motion by branch balancing.
Figure 7B:
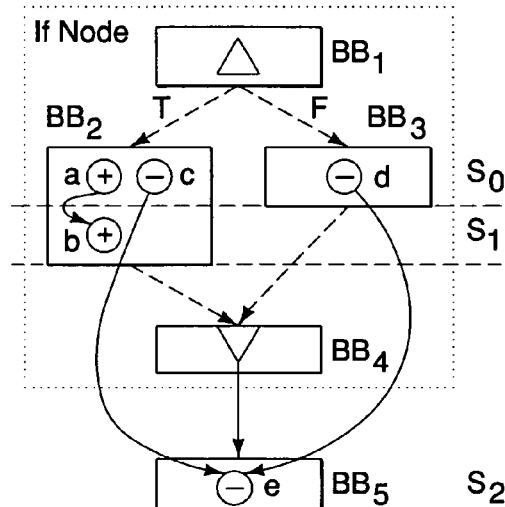

Often design descriptions are structured so that one conditional branch in an if-then-else HTG node has fewer scheduling steps than the other. We call this an If-HTG with unbalanced conditional branches. Consider the input description shown in FIG. 7(a). One possible scheduled design (with a resource allocation of an adder and a subtracter) is as shown in FIG. 7(b): operations a and c execute concurrently in state S0 in basic block $BB_2$. The state assignments (S0, S1, and so on) are demarcated by broken lines in these figures. We can see from FIG. 7(b) that, after scheduling this example, the false branch ($BB_3$) of the If-HTG node has fewer scheduling steps than the true branch ($BB_2$). Thus, If Node is an If-HTG in FIG. 7(b) with unbalanced conditional branches.

In such unbalanced If-HTGs, it is possible to insert a new scheduling step in the branch with fewer scheduling steps, without increasing the length of the longest path through the If-HTG. Hence, in the scheduled design in FIG. 7(b), we can insert a new scheduling step in basic block $BB_3$ since $BB_2$ has more scheduling steps than $BB_3$ This new step and the presence of a scheduling step in $BB_2$ with an idle subtracter enables the conditional speculation of operation e, as operations $e_1$ and $e_2$ in basic blocks $BB_2$ and $BB_3$ respectively. The resulting design is shown in FIG. 7(c).

Figure 7C:
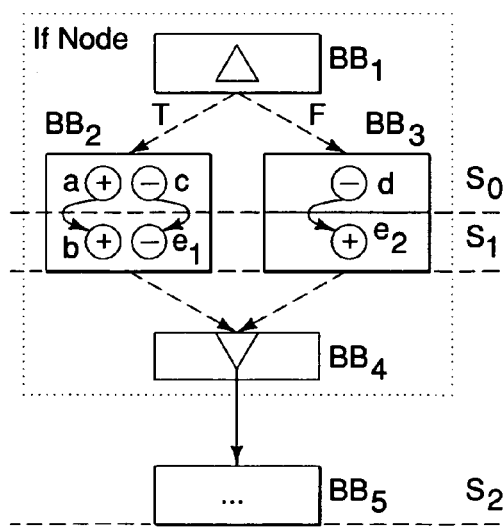

The design in FIG. 7(c) requires one state less to execute than the scheduled design in FIG. 7(b). Thus, branch balancing can introduce new opportunities for applying conditional speculation and thus, further compact the design schedule. Also, since the longest path through the If-HTG is unaltered, this technique does not lead to an increase in longest path length through the design. Note that, if profiling information is available, we can instead insert scheduling steps to basic blocks in branches that are less likely to be taken.

To enable code motions, branch balancing has to be employed dynamically during scheduling. If branch balancing is applied after scheduling, it is too late to affect scheduling decisions. Conversely, branch balancing cannot be applied before scheduling since the number of scheduling steps in the branches of the conditional block is known only after scheduling them.

Figure 8:
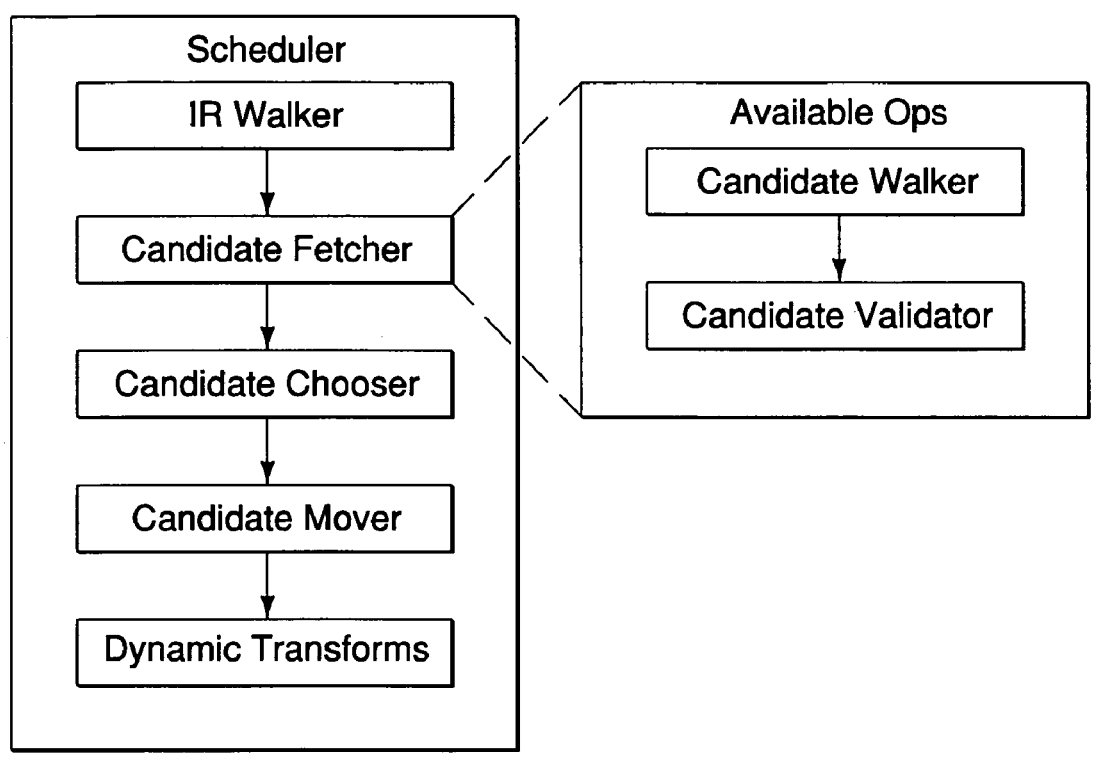
FIG. 8 is an architecture of a scheduling heuristics in a high-level synthesis (HLS) system.

FIG. 8 shows one embodiment of the overall architecture of the scheduler. The components of this scheduler are:

(a) An IR (intermediate representation) Walker that traverses the design and returns the next step and basic block to schedule.

(b) A Candidate Fetcher that itself consists of two components:
  (i) A Candidate Walker that traverses the design and finds the unscheduled operations that are candidates for scheduling on the current step being scheduled. These candidate operations are called Available Operations.
  (ii) A Candidate Validater that removes those unscheduled available operations whose data dependencies are not satisfied or that cannot be moved to the current step being scheduled.

(c) A Cost Function that calculates the cost of each candidate in the available operations list. The scheduler then picks the operation with the lowest cost.

(d) A Candidate Mover that moves the chosen operation from its current basic block to the current step being scheduled.

(e) A Dynamic Transformations pass that applies low level compiler optimizations such as common sub-expression elimination (CSE) and copy propagation dynamically during scheduling, based on the new position and possible duplication of the scheduled operation.

We perform dynamic branch balancing during two tasks of the scheduler:

1 Branch Balancing during Design Traversal (BBDDT): The IR Walker traverses the design in a top-down manner starting from the first basic block in the design. It traverses the control-flow graph of the design in a topologically manner until all the basic blocks have been visited (i.e. scheduled). During this design traversal, we balance the branches of unbalanced conditional blocks as they are encountered.

2 Branch Balancing during Code Motions (BBDCM): The Candidate Mover can call the branch balancing algorithm to insert new scheduling steps in unbalanced conditional blocks if this enables a code motion required to move the candidate operation. This means that during the Candidate Validater task, we validate operations that can be moved if branch balancing is employed.

Our high-level synthesis scheduler calls the function GetNextSchedulingStep to get the steps to schedule in the design. One embodiment of the algorithm for this function is outlined below.

```
GetNextSchedulingStep( )
Inputs: G_HTG of design, current scheduling step currStep
Output: next scheduling step nextStep
1:      if (currStep =ø) then
2:          currentBB =GetNextBasicBlock(G_HTG, ø)
3:          return FirstStep(currentBB)
4:      else
5:          currentBB = ParentBB(currStep)
6:      endif
7:      nextStep: NextStep(currentBB, currStep)
8:      If (nextStep = ø) then
9:          nextBB = BalanceBranchesDuringTrav(G_HTG, currentBB)
10:     if (nextStep = ø) then
11:         nextBB = GetNextBasicBlock(currentBB)
12:         if (nextBB ≠ ø) then
13:             nextStep = FirstStep(nextBB)
14:     endif
15:     return nextStep
```

This algorithm takes as input the current scheduling step currStep and returns the next step (nextStep) in the design to schedule. On the first call to the algorithm (i.e. currStep is f), the algorithm calls the GetNextBasicBlock function to get a basic block to schedule. Since it is also the first call to the GetNextBasicBlock function (not given here), it returns the first basic block in the design graph $G_{HTG}$. The GetNextSchedulingStep algorithm then returns the first step in the basic block (lines 1 to 3 in the algorithm).

For subsequent calls, the GetNextSchedulingStep function first determines the current basic block currentBB that currStep is in. This is obtained by function ParentBB. nextStep is then the scheduling step after currStep in currentBB (line 5 in the algorithm). The algorithm then checks if nextStep is null; this happens when currStep is the last scheduling step in currentBB. In this case, the algorithm should traverse the design graph and get the next basic block in the design to schedule. However, it is at this point that we employ the branch balancing algorithm by making a call to the function BalanceBranchesDuringTrav (lines 7 and 8). This function is discussed below.

The BalanceBranchesDuringTrav function returns the newly created scheduling step if branch balancing is successful. This new step is then returned by the GetNextSchedulingStep algorithm to the scheduler. However, if the BalanceBranchesDuringTrav function returns a null step, nextStep is still null (line 10). The GetNextSchedulingStep algorithm proceeds to get the next basic block, nextBB, in the design by calling the GetNextBasicBlock function. The first scheduling step in the basic block returned by this function is then the nextStep (lines 11 to 13 in the above algorithm). The GetNextSchedulingStep algorithm returns this nextStep. If GetNextBasicBlock returns an empty basic block (or if nextStep in nextBB is null), this indicates to the scheduler that all the basic blocks in the design (and the scheduling steps in them) have been scheduled. The scheduler then terminates.

One embodiment of an algorithm for the BalanceBranchesDuringTrav function is outlined below.

```
BalanceBranchesDuringTrav( )
    Inputs: G_HTG of design, current basic block currentBB
    Output: newly created scheduling step newStep
1:      newStep = ø
2:      complementBB = GetComplement (G_HTG, currentBB)
3:      if(complementBB ≠ ø and IsScheduled (complementBB) then
4:          if(NumSteps(currentBB) < NumSteps(complementBB)) then
5:              newStep = CreateNewStepInBB(currentBB)
6:      return newStep
```

This algorithm takes the HTG of the design, $G_{HTG}$ and the current basic block currentBB as input. The algorithm starts by determining the complementary basic block complementBB of currentBB. The complementary basic block of currentBB exists if currentBB is in an If-HTG node and is the basic block in the mutually exclusive conditional branch of currentBB. Hence, if the currentBB is in the true branch, then its complementBB is the false branch of vice versa.

If a complementBB exists and if it has already been scheduled, then we check if complementBB has more scheduling steps than currentBB (lines 3 and 4). If so, then the If-HTG has unbalanced conditional branches and the BalanceBranchesDuringTrav algorithm calls the function CreateNewStepInBB to create a new scheduling step in currentBB (lines 4 and 5). This new scheduling step is returned by the BalanceBranchesDuringTrav algorithm.

Figure 9A:
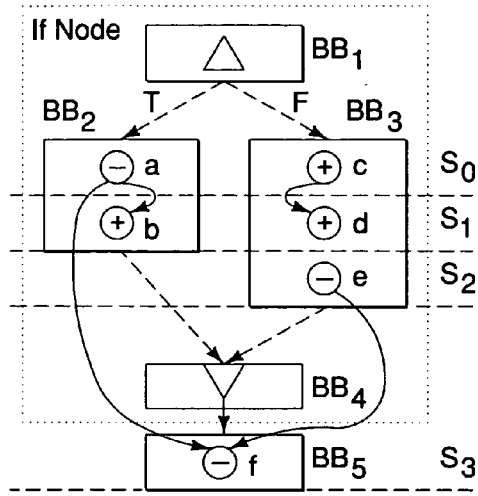
FIGS. 9(a)-9(c) are diagrams for illustrating an algorithm for adding new scheduling steps in the shorter branch of a conditional block.
Figure 9B:
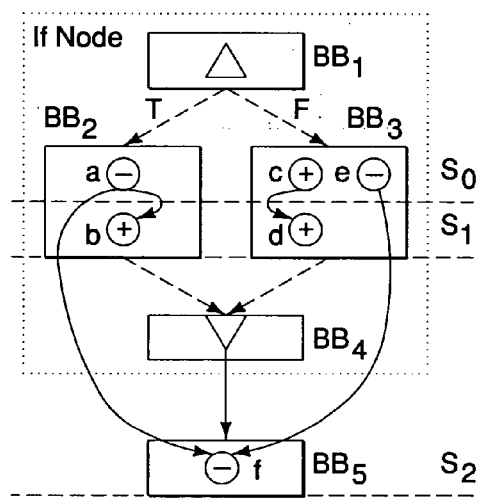
Figure 9C:
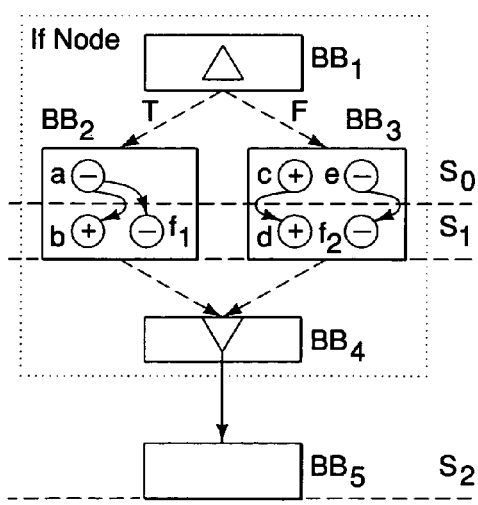

To understand why we insert scheduling steps in complementBB only if it is scheduled (line 3 in the algorithm), consider the example in FIG. 9(a). Suppose that we schedule the true branch of the If-HTG first. Hence, while scheduling $BB_2$ the algorithm detects that its complementary basic block $BB_3$ has more scheduling steps. However, it would be erroneous to insert a new scheduling step in $BB_2$ without scheduling $BB_3$. This is because after scheduling, $BB_3$ has the same number of scheduling steps as $BB_2$ as shown by the scheduled design in FIG. 9(b).

In accordance with another embodiment of the present invention, branch balancing may also be performed when moving an operation in the design. This is demonstrated by the example in FIG. 10(a). In this example, consider that basic block $BB_5$ is the last conditional branch to be scheduled among the branches $BB_2$ $BB_4$, $BB_5$. While scheduling $BB_5$ the scheduler finds that it is possible to schedule operation f into the second scheduling step of $BB_5$ by conditional speculation. However, this requires f to be duplicated into basic blocks $BB_2$ and $BB_5$. Although $BB_2$ has a resource that is unused in its second scheduling step, $BB_4$ does not have an idle resource.

Figure 10A:
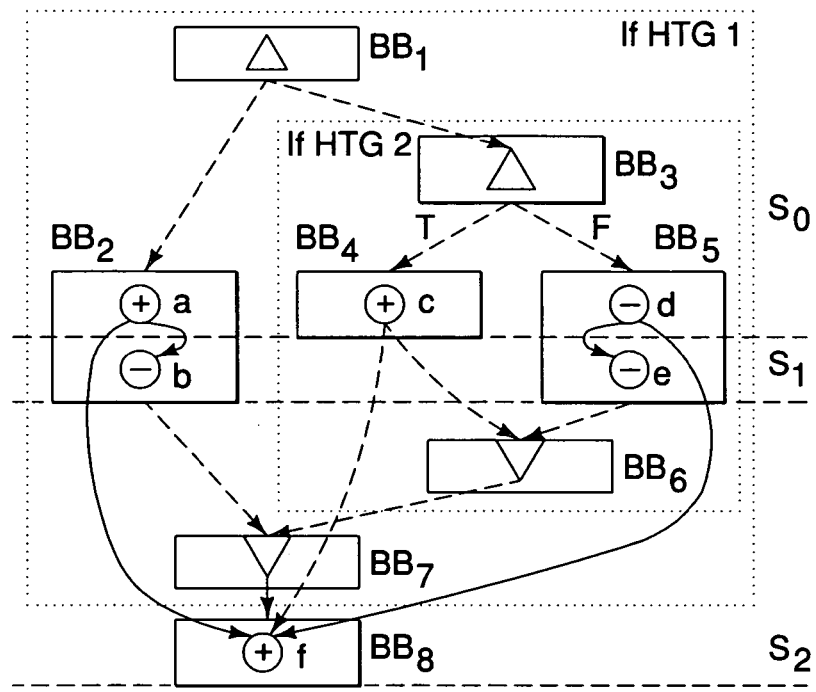
FIGS. 10(a)-10(c) illustrate an algorithm for performing branch balancing when moving an operation in a design.
Figure 10B:
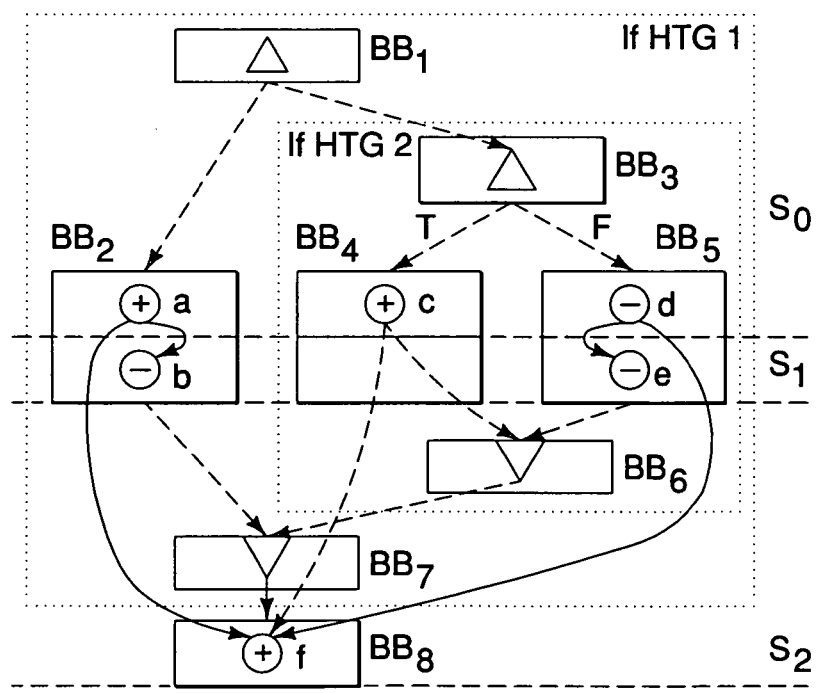
Figure 10C:
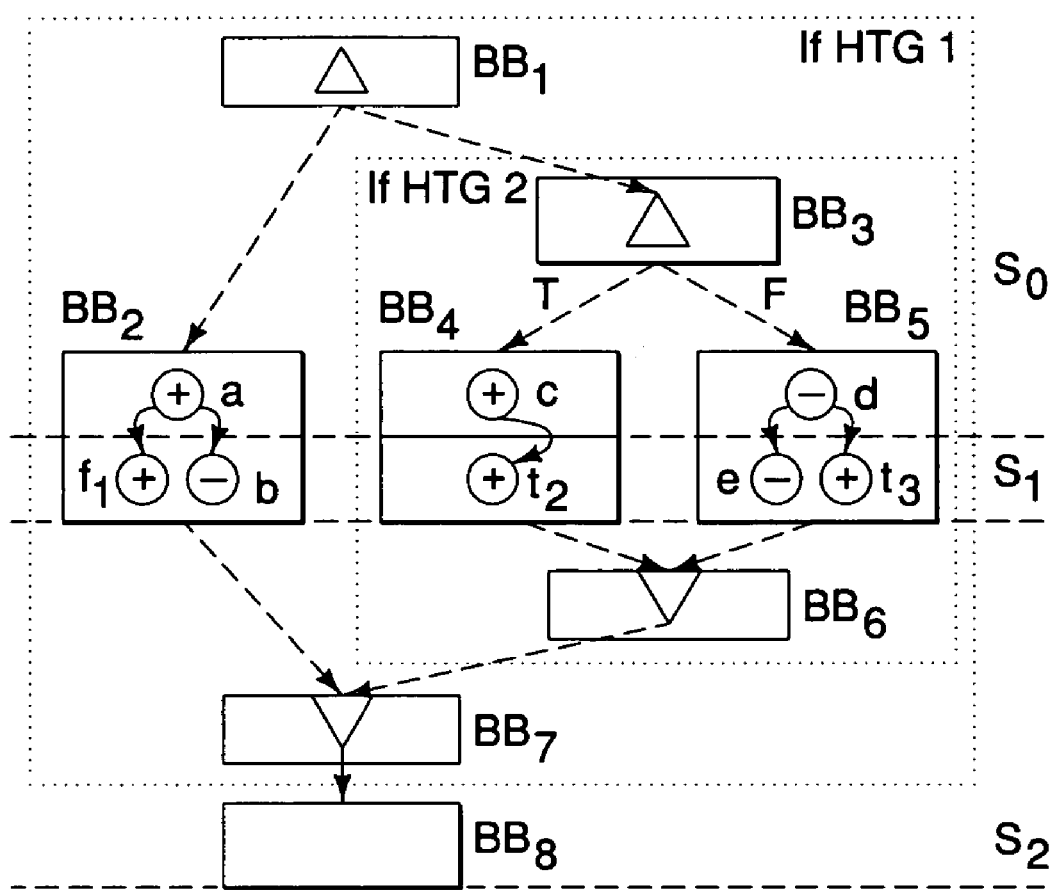

It is at this point that we can take advantage of the fact that $BB_4$ is part of an unbalanced conditional branch. We can insert a new scheduling step in $BB_4$ since $BB_4$ has fewer scheduling steps than $BB_2$ and $BB_5$ as shown in FIG. 10(a). This enables us to speculate operation f conditionally as the operations f1, f2 and f3 in basic blocks BB 2, BB4 and BB5. This resultant design is shown in FIG. 10(c).

Thus it is possible to employ branch balancing to enable code motions. We integrate this BBDCM technique into our scheduler at two places:

(a) Candidate validater: We validate operations that can be conditionally speculated if branch balancing is employed on the conditional branches that the operation will be duplicated into.

(b) Candidate mover: This is where we perform the branch balancing if the scheduler decides to schedule an operation validated earlier on the premise of branch balancing.

One embodiment of an algorithm that the candidate validater calls to validate operations that require duplication for scheduling is listed is listed below.

```
CanOperationBeMoved( )
    Inputs:  operation op, scheduling step currStep, basic block currentBB,
             basic block list BBList in which op will be duplicated
             to schedule at currStep
    Output: whether op can be duplicated into BBList and scheduled
             on currStep
1:     foreach (Basic block bb in BBList) do
2:         if(IsScheduled(bb) = = false)
3:             return false
4:         if (FindIdleResinBB(bb, op) = = ø)
               /*No idle resource. Hence, check if we can insert a new
               step by branch balancing */
5:             if (NumSteps(bb) ≧ NumSteps(currentBB)) then
6:                 return false /* Not possible to insert op in bb */
7:     endforeach
8:     return true /* It is possible to insert op in all basic
               blocks in BBList */
```

This algorithm, called CanOperationBeMoved, takes as input the list of basic blocks (BBList) into which an operation op will have to be duplicated if it were to be scheduled on the scheduling step CurrStep in basic block currentBB. The algorithm returns a true result if it is possible to duplicate op into the basic blocks in BBList and false otherwise.

If any basic block bb in the BBList is unscheduled, then this algorithm returns a false result (line 3 in the algorithm). This is because we do not know the resource utilization in an unscheduled basic block. Only after scheduling do we know the number of scheduling steps in a basic block and which resources are idle in each scheduling step.

For each scheduled basic block bb in the BBList, the algorithm calls the function FindIdleResInBB to find an idle resource on which operation op can be scheduled. This function is presented below. If the FindIdleResInBB does not find an idle resource in bb to schedule op, then the CanOperationBeMoved algorithm checks if it is possible to schedule op in bb by performing branch balancing first. It thus checks if bb has more scheduling steps than currentBB (line 5 in the algorithm). If this is true, then it is not possible to insert a new scheduling step into bb and hence we cannot schedule op in bb. The CanOperationBeMoved function thus returns a false result (line 6).

If the basic block bb either has an idle resource for op for bb has fewer scheduling steps than currentBB, it is possible to insert to schedule op in bb. The CanOperationBeMoved algorithm checks all the basic blocks in BBList in the same manner and returns a true result if it is possible to schedule a copy op in each bb in BBList either on an idle resource or by inserting a scheduling step (by branch balancing). This algorithm is used by the scheduler during candidate validation. If the scheduler decides to schedule an operation that requires conditional speculation, a similar algorithm is used by the candidate mover to schedule op in each basic block bb in BBList by inserting scheduling steps if required.

One embodiment of an algorithm to find an idle resource for an operation op in a basic block bb is outlined below.

```
FindIdleResinBB( )
    Inputs: operation op, basic block bb
    Output: scheduling step in bb with idle resource for op
1:     matchingResList = FindMatchingRestforOP(op)
2:     currStep = GetSTepInBBAfterDataDeps(bb, op)
3:     while (currStep ≠ ø) do
4:         foreach (res ∈ matchingResList) do
5:             if (IsResourceIdleinStep(step, res) = = true)
```
-continued
```
6:                 numSteps = ExecCycles (res) −1
7:                 prevSteps = GetPrevSteps (GHTG, currentStep,
                       numSteps)
8:                 succSteps = GetSuccSteps (GHTG, currStep,
                       numSteps)
9:                 if (res is idle in prevSteps and succSteps)
10:                    return currStep
11:        endforeach
12:        currStep = NextStep(bb, currStep)
13:    endwhile
14:    return ø
```

This algorithm starts by calling the function FindMatchingResForOp (not given here) to determine the list of resources, matchingResList, on which the operation op can be executed. There may be multiple resources in matchingResList as there may be several instances of the resource type on which op may execute.

The FindIdleResInBB function then calls the function GetStepInBBAfterDataDeps to find the first scheduling step in bb that does not have an operation with a data dependency with op. This function (not given here) looks for operations whose result op reads and that are in basic block bb. It then finds the last scheduling step in bb with any of these operations that op depends on and returns the next scheduling step. This returned step, currStep, signifies the first scheduling step in bb that op can be potentially scheduled on. Note that the ordering of scheduling steps in a basic block denotes their execution sequence.

Using this scheduling step (currStep) as a starting point, the FindIdleResInBB algorithm determines if there is an idle resource for op in currStep or any of its successor steps in basic block bb (shown by the while loop in the algorithm). Each resource res in matchingResList in currStep is checked to see if it is idle, i.e. there is no operation scheduled on it and hence it is potentially available for scheduling the operation op (lines 4 and 5 in the algorithm).

If res is idle in currStep, and if res is a multi-cycle resource, we must make sure that res is idle in scheduling steps before and after currStep for the duration of its execution. We first determine the number of steps numSteps that need to be checked. numSteps is one less than the execution cycles of the resource (line 6 in the algorithm). The algorithm then calls the GetPrevSteps and GetSuccSteps functions to get numSteps predecessor steps and numSteps successor steps (lines 7 and 8). Since the predecessor and successor steps can, and frequently are, in the predecessor and successor basic blocks of bb, these two functions (not described here) look for steps not only in the current basic block bb but also may traverse to the predecessor and successor basic blocks of bb. Hence the resource utilization of the resource res has to be checked beyond the current basic block.

If the resource res is not used in any of these predecessor and successor steps, an idle resource has been found in the current step currStep and the algorithm terminates by returning currStep (lines 9 and 10 in the algorithm). However, if res is used in any of these steps, the procedure is repeated for the next resource in the matchingResList and so on. This is done for all the steps following currStep in the given basic block bb, until either a step with an idle resource is found or all the steps in bb have been visited.

The FindIdleResInBB function is called by the candidate validater and by the candidate mover. Whereas the validater only checks for idle resources in basic blocks, the candidate mover schedules the operation op on the scheduling step currStep returned by the FindIdleResInBB function.

Figure 11A:
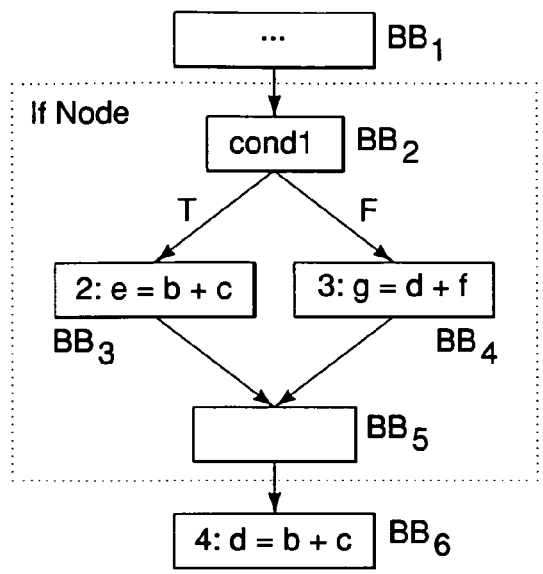
FIGS. 11(a)-11(c) illustrate dynamic common sub-expression elimination (CSE) on a sample HTG.
Figure 11B:
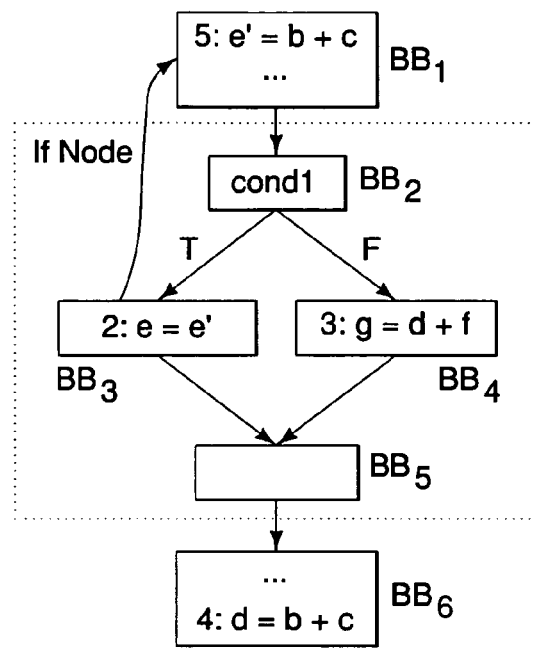

Turning now to FIG. 11(a), we illustrate how the speculative code motions can create new opportunities for applying common sub-expression elimination (CSE) in accordance with an embodiment of the present invention. In the example shown in FIG. 11(a), classical CSE cannot eliminate the common sub-expression in operation 4 with operation 2, since operation 4's basic block BB6 is not dominated by operation 2's basic block BB3. Consider now that the scheduling heuristic decides to schedule operation 2 in BB1 and execute it speculatively as operation 5 as shown in FIG. 11(b). Now, the basic block BB1 containing this speculated operation 5, dominates operation 4's basic block BB6. Hence, the computation in operation 4 in FIG. 11(b) can be replaced by the result of operation 5, as shown in FIG. 11(c).

Dynamic CSE is a technique that operates after an operation has been moved and scheduled on a new basic block. It examines the list of remaining ready-to-be-scheduled operations and determines which of these have a common sub-expression with the currently scheduled operation. This common sub-expression can be eliminated if the new basic block containing the newly scheduled operation dominates the basic block of the operation with the common sub-expression. We use the term "dynamic" to differentiate from the phase ordered application of CSE before scheduling.

Figure 11C:
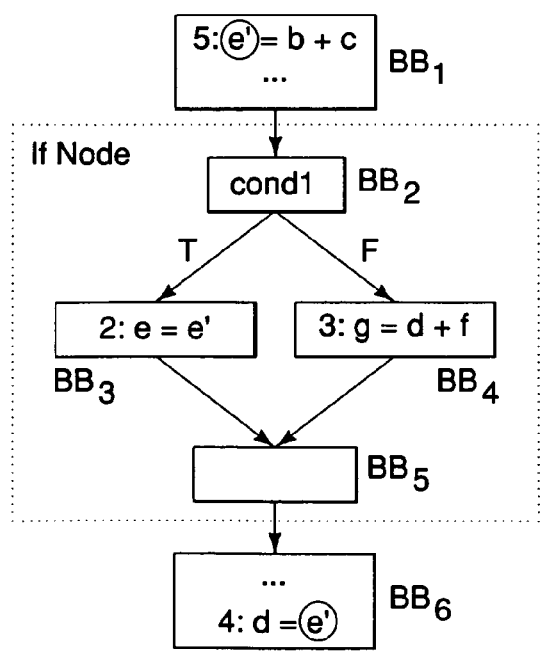

We can also see from the example in FIGS. 11(a) to 11(c) that applying CSE as a pass after scheduling is ineffective compared to dynamic CSE. This is because the resource freed up by eliminating operation 4, can potentially be used to schedule another operation in basic block BB6, by the scheduler. On the other hand, performing CSE after scheduling is too late to effect any decisions by the scheduler.

Besides speculation, anothercode motion that has a significant impact on the number of opportunities available for CSE is conditional speculation. Conditional speculation duplicates operations up into the true and false branches of an if-then-else conditional block. This is demonstrated by the example in FIG. 12(a). In this example, the common sub-expression that operation 2 in BB9 has with operation 1 in BB6 cannot be eliminated since BB9 is not dominated by BB6. Consider now that the scheduling heuristic decides to conditionally speculate operation 1 into the branches of the if-then-else conditional block, If Node 1. Hence, as shown in FIG. 12(b), operation 1 is duplicated up as operations 3 and 4 in basic blocks BB2 and BB3 respectively. These two operations now have a common sub-expression with operation 2 that exists in all control paths leading up to BB9. Hence, dynamic CSE can now replace the computation in operation 2 with the result, a', of operations 3 and 4 as shown in FIG. 12(b).

This leads to the notion of dominance by sets of basic blocks. A set of basic blocks can dominate another basic block, if all control paths to the latter basic block come from at least one of the basic blocks in the set. Hence, in FIG. 12(b), basic blocks BB2 and BB3 together dominate basic block BB9. This enables dynamic CSE of operation 2. In this manner, we use this property of group domination while performing dynamic CSE along with code motions such as reverse and conditional speculation that duplicate operations into multiple basic blocks.

The dynamic CSE can also be applied to copy propagation. After applying code motions such as speculation and transformations such as CSE, there are usually several copy operations left behind. Copy operations read the result of one variable and write them to another variable. For example in FIG. 12(b), operations 1 and 2, copy variable a' to variables a and d respectively. These variable copy operations can be propagated forward to operations that read their result. Again, traditionally, copy propagation is done as a compiler pass before and after scheduling to eliminate unnecessary use of variables. However, we have found that it is essential to propagate the copies created by speculative code motions and dynamic CSE during scheduling itself, since this enables opportunities to apply CSE on subsequent operations that read these variable copies. A dead code elimination pass after scheduling can then remove unused copies.

In accordance another embodiment of the invention, loop shifting is a method whereby an operation op is moved from the beginning of the loop body to the end of the loop body, along the back-edge of the loop. To preserve the correctness of the program, a copy $op_c$ of operation op is placed in the loop head/prologue. Thus, $op_c$ is executed before the first iteration of the loop body and the original operation op is then executed at the end of the loop body. This execution corresponds to the execution of op from the next loop iteration as per the original code.

Figure 13A:
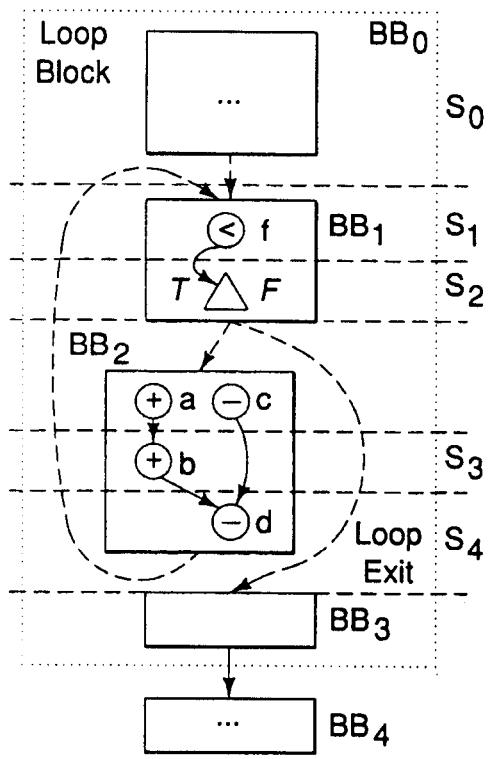
FIGS. 13(a)-13(c) are diagrams illustrating loop shifting operations in a control flow.
Figure 13B:
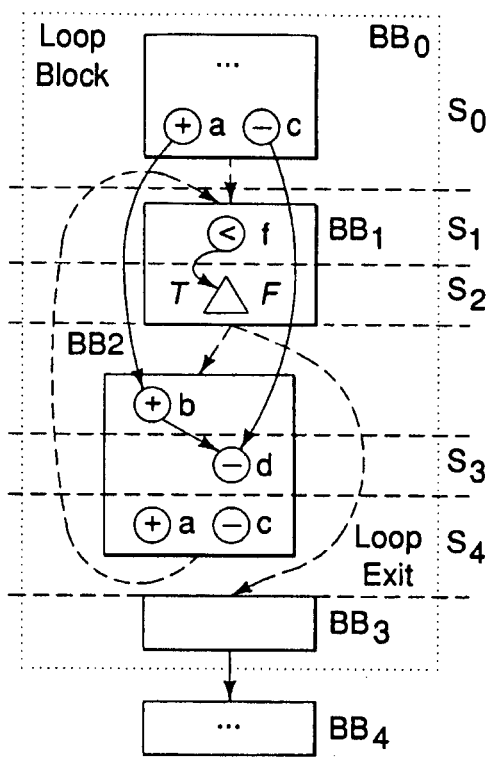
Figure 13C:
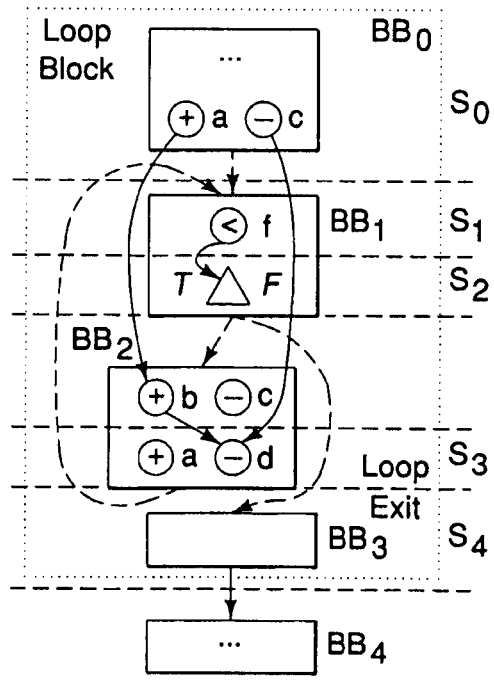

We demonstrate loop shifting with an example in FIG. 13(a)-13(c). In this example, basic blocks BB1 and BB2 form the body of a loop and BB0 is the loop head and BB3 is the loop exit or tail. Solid arrows indicate data flow and dashed arrows indicate control flow. Consider that we shift operations a and c from the loop body in the original design in FIG. 13(a) to the end of the loop body (BB2) and copies of a and c are inserted in the loop head (BB0). The resultant design is shown in FIG. 13(b).

We can now compact the code inside the shifted loop body using parallelizing transformations. In the shifted design, it is possible to schedule operation a concurrently with operation d and c concurrently with operation b. The resultant, compacted design is shown in FIG. 13(c). The state assignments (S0 to S4) for these three designs are demarcated by dashed lines. Clearly, the design in FIG. 13(c), after shifting and compaction, has a shorter schedule length than the original design in FIG. 13(c). Thus, as a result of loop shifting and compaction, the loop body executes in fewer cycles. These fewer cycles multiplied by the loop iteration count give us the reduction in execution cycles of the design.

Shifting an operation leads to one extra execution of the operation over the number of times it is executed in the original code. This can be understood by the shifted design shown earlier in FIG. 13(c). In this design, if the loop executes for 8 iterations, then the shifted operation a executes 8 times inside the loop body plus once in the loop head (basic block BB0). In contrast, in the original design in FIG. 13(a), operation a executes only 8 times inside the loop body.

To ensure that executing the shifted operation one extra time does not change the behavior of the program, we write the result of the shifted operation, op, to a new variable, newVar and in place of op, we leave a copy operation from newVar to the result variable of the original operation op.

Figure 14A:
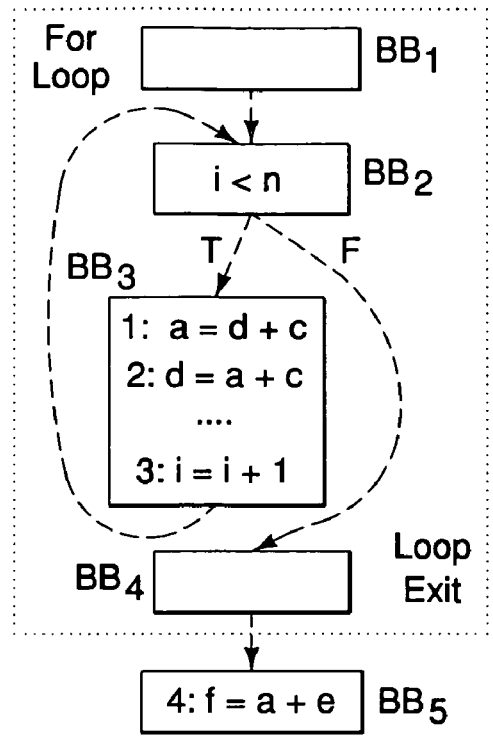
FIGS. 14(a)-14(b) are diagrams illustrating that executing a shifted operation does not lead to behavior change of a program.
Figure 14B:
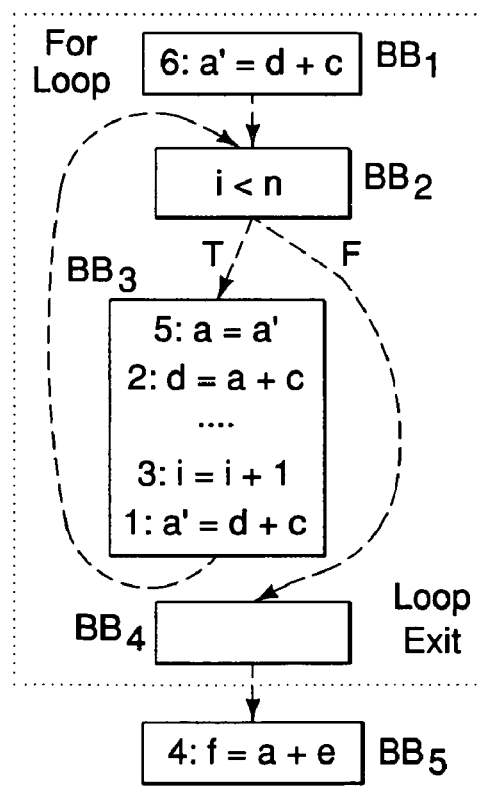

We demonstrate this through an example in FIG. 14(a). Here, the result of operation 1 in the loop body (in basic block BB3) is read by operation 4 after the loop. Consider that we shift operation 1 to the end of the loop body and place a copy as operation 6 in the loop head. Both these operations write to a new variable a' and a copy operation a=a' is left in place of the original operation 1. This ensures that operation 4 gets the correct value of a after loop shifting. The resultant design is shown in FIG. 14(b).

We also have to maintain the inter and intra-iteration data dependencies while applying loop shifting since a shifted operation may have data dependencies across loop iterations. In the example in FIG. 14(a), operation 1 reads the variable d that is written by operation 2. Hence, after shifting operation 1, we have to add a data dependency arc from operation 2 to shifted operation 1.

Figure 15A:
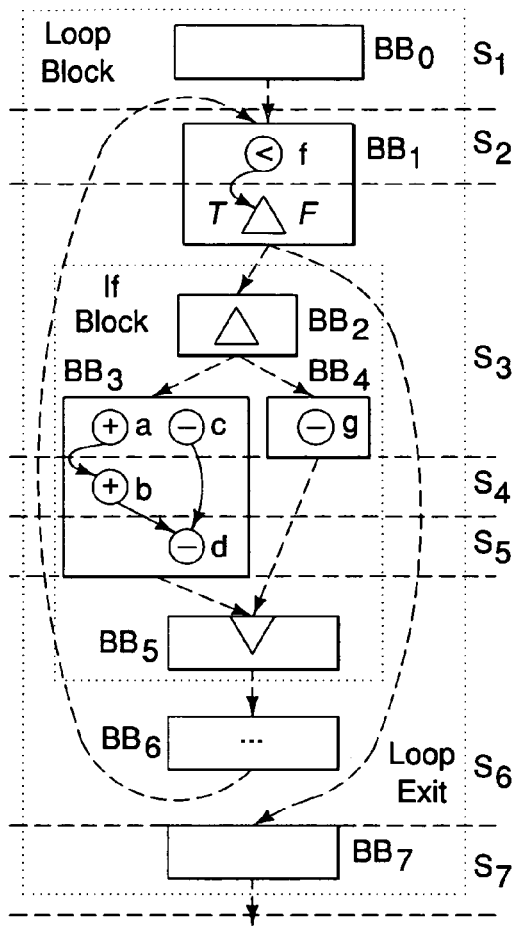
FIGS. 15(a)-15(c) are diagrams for illustrating a loop shifting process.
Figure 15B:
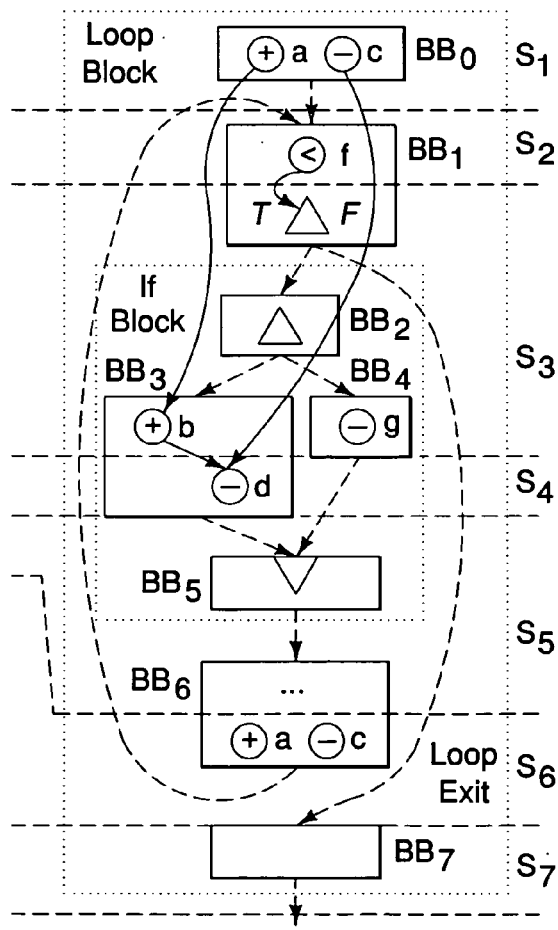
Figure 15C:
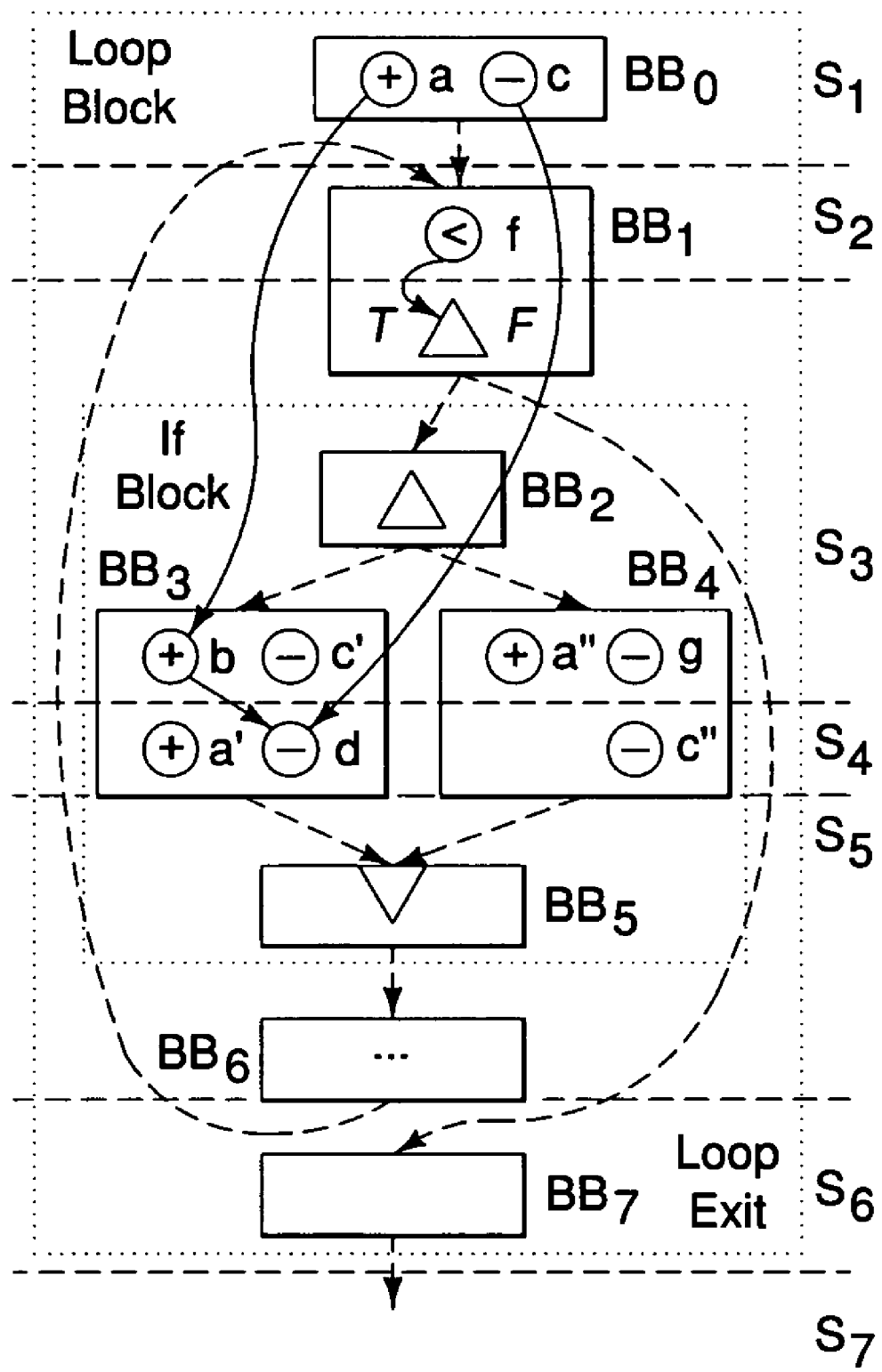

In loops with conditional constructs, operations can be shifted from within a conditional branch. To minimize the length of the longest path through the design, we shift operations from the branch of the conditional with the longer schedule length. Consider the example in FIG. 15(a). This example has an if-then-else conditional block within the body of a loop. Since the true branch (basic block BB3) of this if-block has a longer schedule length (of 3) than the false branch (BB4), we choose to shift operations from basic block BB3. Hence, consider that we shift operations a and c from BB3, as shown in FIG. 15(b). The parallelizing code transformations can now compact the shifted code by duplicating operations a and c into both branches of the if-block, as operations a' and a" and c' and c". The resultant design is shown in FIG. 15(c). Note that, we employ a code motion called conditional speculation for operation duplication.

We perform loop shifting after scheduling the loop body once. The scheduler may schedule some operations to execute concurrently in the same cycle. We term a set of concurrent operations in a basic block as a scheduling step. In our approach, instead of shifting one operation at a time, we shift an entire scheduling step across loop iterations. This is because shifting only one of several concurrent operations will not eliminate the scheduling step and thus, the schedule length of the basic block (and loop body) will not decrease. In the design in FIG. 15(a), we chose to shift the first scheduling step in BB3, i.e., both operations a and c (instead of just one of them).

Loop unrolling is a code transformation in which a duplicate of one or more iterations of the loop body is placed at the end of the current loop body. The loop bounds and loop index variable increment are updated as necessary. Loop unrolling is used for exposing parallelism across loop iterations and thus, enable code compaction of the unrolled loop body. However, loop unrolling can lead to code explosion; so, loops are usually unrolled one iteration at a time. In one embodiment, the number of unrolls for each loop is user-directed. A synthesis tool would first unroll the loop as specified by the designer and then schedules the design.

One embodiment of our loop shifting algorithm is listed below.

```
ShiftLoopBody(LoopNode)
    1: firstBB← FirstBB(LoopNode→loopBody)
    2: stepToSh f t ←FindStepToShift(firstBB)
    3: BB(stepToShi f t) ←BB(stepToShi f t) − stepToShi f t
    4: lastBB ←LastBB(LoopNode→loopBody)
    5: lastBB ←lastBB U stepToShi f t
    6: loopHeadBB ←LastBB(LoopNode →loopHead)
    7: loopHeadBB ←loopHeadBB U Copy(stepToShi f t)
    8: Reschedule(LoopNode)
```

This algorithm takes the loop node to be shifted as input and shifts one scheduling step from the beginning of the loop body to its end.

We use the Hierarchical Task Graphs (HTGs) as the intermediate representation that encapsulates constructs such as loops, if-then-else blocks in hierarchical nodes that in turn may have sub-nodes. Using this intermediate representation, we can access the sub-parts (loop head, body, and tail) of a loop by referring to LoopNode!loopHead, LoopNode!loopBody and LoopNode!loopTail. The loop head and loop tail each contain one basic block, whereas the loop body is a hierarchical node that may contain other hierarchical nodes (including if-then-else blocks and other loops). By definition, each HTG node HtgNode has a Start (or first) basic block and a Stop (or last) basic block that can be obtained by FirstBB(HtgNode) and LastBB(HtgNode).

The loop shifting algorithm starts by looking for a scheduling step to shift. To do this, it calls a function FindStepToShift with the first basic block in the loop as argument. This function, listed below, calls the function FirstNonCondStep for each basic block currBB.

```
FindStepToShift(currBB)
    Returns: The step to shift
    1:      stepToShift ←FirstNonCondStep(currBB)
    2:      if (stepToShi f t = Ø {
    3:          Find nextBB ∈ SUCCS(currBB) with the
                    maximum NumSteps(nextBB)
    4:          stepToShift ←FindStepToShift(nextBB)
    5:      }
    6:      return stepToShift
```

This function returns a NULL step if currBB is empty (due to past shift operations) or currBB only has scheduling steps with conditional Boolean checks (denoted by triangles in our figures). If FirstNonCondStep does not find a scheduling step, the FindStepToShift function recursively traverses the basic blocks in the loop body till it finds a scheduling step in one of them. If a basic block has several successor basic blocks (branches), the algorithm traverses to the branch with the larger number of scheduling steps.

Once the FindStepToShift function returns a scheduling step stepToShift, this step is removed from its basic block, and added to the last basic block in the loop body (lines 3 to 5 in the algorithm). A copy of stepToShift is also added to the loop head (lines 6 and 7). We then reschedule the loop by calling the function Reschedule. Note that, by adding or removing a scheduling step, we mean that the operations in that step are added or removed from a basic block.

Figure 16:
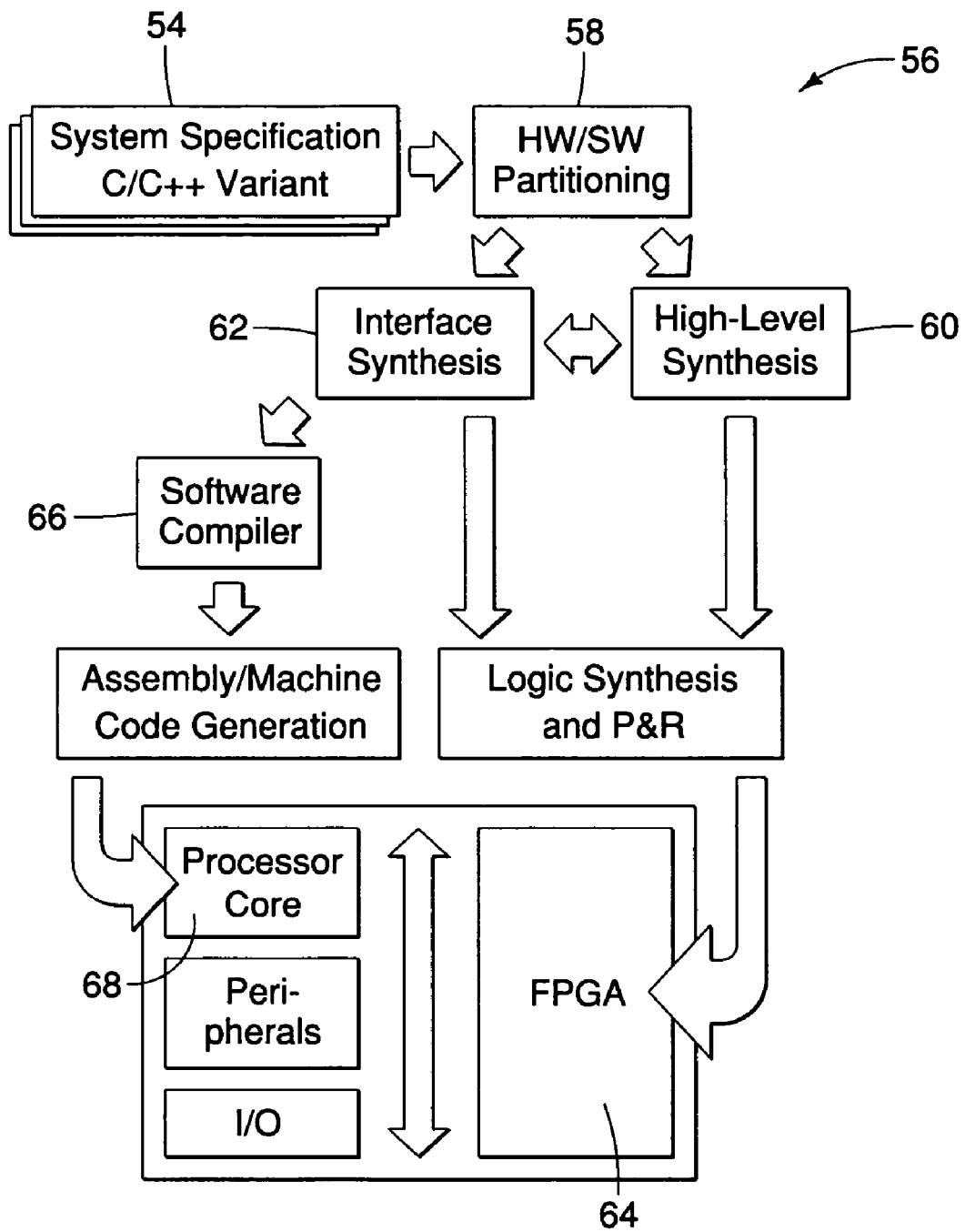
FIG. 16 is a block diagram of an interface synthesis system.

Turning now to FIG. 16, interface synthesis is another aspect of our present invention. In our approach, we rely on a C/C++ based description 54 for the system 56. After hardware-software partitioning 58, the hardware part is scheduled using a high-level synthesis tool 60 and the scheduling information is passed to the interface synthesizer 62.

This interface synthesizer 62 generates the hardware interface and reinstruments the software component of the application to make appropriate calls to the hardware component via this interface. It also passes the addresses of all registers that have been mapped to memories in the hardware interface to the high-level synthesis tool 60.

The RTL code generated by the high-level synthesis tool 60 and the interface synthesizer 62 are then downloaded to the FPGA 64. Similarly, the software component is compiled by a software compiler 66 and downloaded into the instruction memory of the processor 68 after going through an Assembly/Machine code generator 70.

Multimedia and image processing applications, for example, process large amounts of data. After partitioning, the hardware component has to operate on the same data that the software operates on. Thus, the hardware component needs to store this data on the FPGA 64. The way this data is mapped to a memory has tremendous impact on the complexity of the multiplexers and the generated control logic. In our memory mapping approach, we utilize scheduling information—available from the high-level synthesis tool 60—about data accesses and the cycles that they occur in. We can then map the data elements to memory banks, given constraints on the maximum number of ports each memory in the target FPGA 64 can have. This approach eliminates the use of registers for storage, thus, saving a large amount of area. This way, we can also use much smaller and faster multiplexers in the data-path. Arrays and data structures are mapped to memories after being broken down into their basic constituents (variables). These can then be mapped in a way identical to regular variables.

We are given a set of n variables, V={vi; i=1;2; : : : ;n} that are accessed (read and written) by all the kernels of the application. In our current model, only one kernel executes at any given time. This implies that contention for variable accesses between two kernels can never occur. Note that, each element in an array or data structure is considered as a distinct variable vi in V; so for example, an array of size n will have n entries in V. We are also given a set of memory resource types, Mtype={mj; j 2 Z+} where the subscript j indicates the maximum number of ports available. The number of read ports of memory type mj are given by Portsread(mj) and write ports by Portswrite(mj).

The problem defined above is an extension of the memory mapping and value grouping problem for datapath synthesis, which is known to be NP-complete. We adopt a heuristic approach to solving it; an embodiment of our memory mapping algorithm is listed below.

```
Algorithm: MapVariablesToMemories(V)
    Output: Memory instances used in the design M,
        Mapping between memory instances and variables φ
1:  Initialize M ←∅
2:  foreach (v_i ∈ V) do
3:      L ←GetListOfCandMems(M, v_i)
4:      if (L ≅ ∅) then /* Create a new memory instance */
                /* with a minimal number of ports to satisfy v_i */
5:              Add new instance (mp, n) of memory type m_p to M
6:              φ(mp,n)← v_i /* map v_i on nth instance of m_p
7:      else /* L is not empty */
8:          Pick ((m_j,k),m_p) ∈ L with lowest cost
9:          if (mp≠ m_j) then
                /* Add new qth instance of mem type m_p to M */
10:             M ←M ∪ (m_p,q)
11:             φ(m_p,q) ←φ (m_j,k) /* Move variables to (m_p,q) */
12:             M ←M − (m_j,k) /* Discard (m_j,k) */
13:             φ (m_p,q)← φ (m_p,q) ∪ v_c
14:         else /* map v_c to (m_j,k) */
15:             φ (m_j,k)← φ (m_j,k) ∪ v_c
16:         endif
17:     endif
18: endforeach
```

The algorithm processes variables in the order that they are declared in the application. For each variable to be mapped to a memory instance, the algorithm calls GetListOfCandMems to get a list of candidate memory instances (L) onto which the current variable $v_c$ can potentially be mapped (line 3 in the above algorithm).

If this list is empty, a new memory instance with just enough ports for $v_i$ is created, and $v_i$ is mapped to it (lines 4 to 6). If the list is non-empty, we pick the memory instance with the lowest cost. If the number of ports available on this memory instance are sufficient to map $v_i$ to it, then $v_i$ is added to the list of variables φ(m_j; k) mapped to this instance; otherwise, a new memory instance (m_p;q) with enough ports is created. The old memory instance (m_j; k) is discarded after all variables mapped to it have been remapped to (m_p;q). Finally, $v_i$ is mapped to (m_p;q) (lines 9 to 13 in the algorithm).

The algorithm for the function GetListOfCandMems is listed below.

```
GetListOfCandMems(M, v_c)
    Return: Available Memories List L
1:  Initialize List L ←∅
2:  foreach (memory instance (m_j,k) ∈ M) do
3:      if (v_c does not conflict with φ (m_j,k) in any cycle)
            or ((m_j,k) has enough ports to map v_c) then
4:          L ←L ∪ ((m_j,k);m_j))
5:          Cost(m_j,k)← Ports_read (m_j)+Ports_write(m_j)
6:      else /*either conflict or insufficient ports in (m_j,k)*/
7:          if (there exists m_p ∪ M_type with enough ports
8:              to map all variables from (m_j,k) and v_c) then
9:              L ←L ∪ ((m_j,k),m_p))
10:             Cost(m_j,k)←Ports_read (m_p)+Ports_write(m_p)
11:         endif
12:     endif
13: endforeach
```

This algorithm considers each memory instance (m_j; k) in M already allocated to the design, and adds this instance to the list L of candidate memory instances if the variable vc can be mapped to (m_j; k). A variable vc can be mapped to (m_j; k) when, vc does not conflict in terms of reads or writes with any other variable mapped to (m_j; k), or (m_j; k) has enough ports for accessing variable vc besides all the variables already mapped to it (line 3 in the algorithm). Note that these two constraints are identical, i.e., if one is true, it implies that the other is also true.

If (m_j; k) does not have enough ports to map variable vc, then we try to find a memory of type mp, such that, an instance of mp will satisfy the port constraints when variables vc and φ(m_j; k) (variables already mapped to (m_j; k)) are mapped to it. If such a memory type exists, it marks memory instance (m_j; k) for an upgrade to an instance of memory type mp (p>j) and adds it to L (lines 7 to 9).

The above algorithm also calculates a cost for mapping vc to each memory instance in L. This cost equals the total number of read and write ports of the memory instance. Assume that A is the total number of hardware kernels, s is the length of the longest schedule among these kernels, while z is the maximum number of memory accesses occurring in a single cycle by any one variable. Then, lines 2 and 3 in algorithm individually contribute n and Asz to the time complexity respectively. So the GetListofCandMems algorithm has a worst case time complexity of O(nAsz). The loop in line 2 of the MapVariablesToMemories algorithm causes the GetListofCandMems algorithm to execute n times. Thus, the worst case time complexity of the MapVariablesToMemories algorithm is $O(n_2Asz)$.

The GetListOfCandMems algorithm determines if variable vc can be mapped to memory instance (m_j; k) by checking for potential conflicts with the variables φ(m_j; k) that have already been mapped to (m_j; k). This is done for every cycle.

Thus, in every cycle, we create conflict graphs where nodes represent variables and edges denote a conflict between variables (both variables are accessed in that cycle). To understand how we use these conflict graphs, consider a design with three variables v1, v2 and v3. Assume that v1 and v2 are accessed during cycle 1, while v2 and v3 are accessed during cycle 2. The corresponding conflict graphs for the two cycles are given in FIGS. 17(*a*) and 17(*b*). If we have only one memory resource type, namely, a dual ported memory m2, then, each of the three variables can be mapped to the same instance of the dual ported memory without violating the port constraints. This is because only two of the three variables conflict in any cycle. If we had represented this using a single conflict graph for all cycles, variable v2 would not have been mapped to memory because two conflict edges would have been associated with it, even though the accesses occur in different cycles.

In another example, consider an array arr consisting of three elements, arr[1], arr[2] and arr[3]. The corresponding variables in V are v1, v2 and v3. Also, assume that dual ported memories are the only memory types available. In any given cycle, if there are multiple accesses to arr using variable indices i and j (for example arr[i] and arr[j]), then we cannot determine which elements of the array actually conflict until runtime. Hence, we create conflict edges between each pair of elements in arr in the conflict graph corresponding to that cycle. This results in the fully connected conflict graph shown in FIG. 19(c). We can conclude from this conflict graph that none of the three variables can be mapped to the same memory instance since the memory has only two ports.

But, this is an incorrect conclusion because only two of the three variables will be accessed in any cycle. This implies that the three variables can be mapped to a dual ported memory. Thus, we find that per cycle conflict graphs are, by themselves, not powerful enough to capture all the information necessary to perform effective memory mapping.

To address such issues, we introduce the notion of accumulating colors in the nodes of the conflict graphs of each cycle. From among a group of variables $V_G$, if access of any one in a cycle rules out access of the rest in that cycle, then the nodes corresponding to each variable in the group $V_G$ are marked with the same color $c_G$. This color is unique from that of all other groups. A node can accumulate colors by being a member of more than one such group.

Figure 17A:
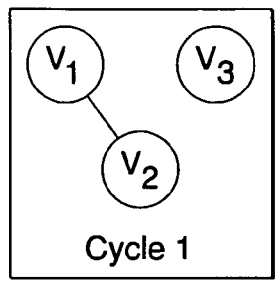
FIGS. 17(a)-17(d) are conflict graphs used in a memory mapping algorithm.
Figure 17B:
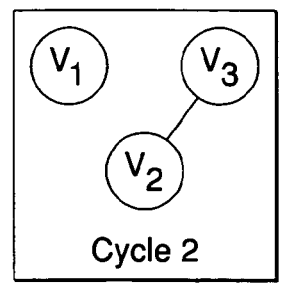
Figure 17C:
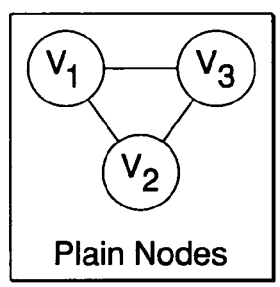
Figure 17D:
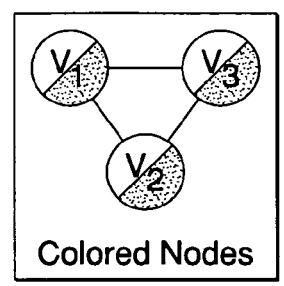

Applying this to our example, we get the conflict graph depicted in FIG. 17(d). v1, v2 and v3 form a group corresponding to access by arr[i]. Each of these three variables are marked with one color since accessing any one of them rules out accessing the other two. Similarly, v1, v2 and v3 form another group corresponding to access by arr[j] and are marked with a second color. Thus, each of the three nodes/variables end up accumulating two colors.

The number of ports needed to map a set of variables to a single memory instance, is equal to the maximum number of colors in any cycle of all the variables being mapped to that memory instance. In our example, the number of colors accumulated by v1, v2 and v3 is two. Thus, we can safely map these three variables to a dual ported memory. We use this coloring technique while creating the per cycle conflict graphs used by our memory mapping algorithm. Note that although we need to store each per cycle conflict graph, we found that for large applications such as MPEG, the storage sizes are easily manageable.

Figure 18:
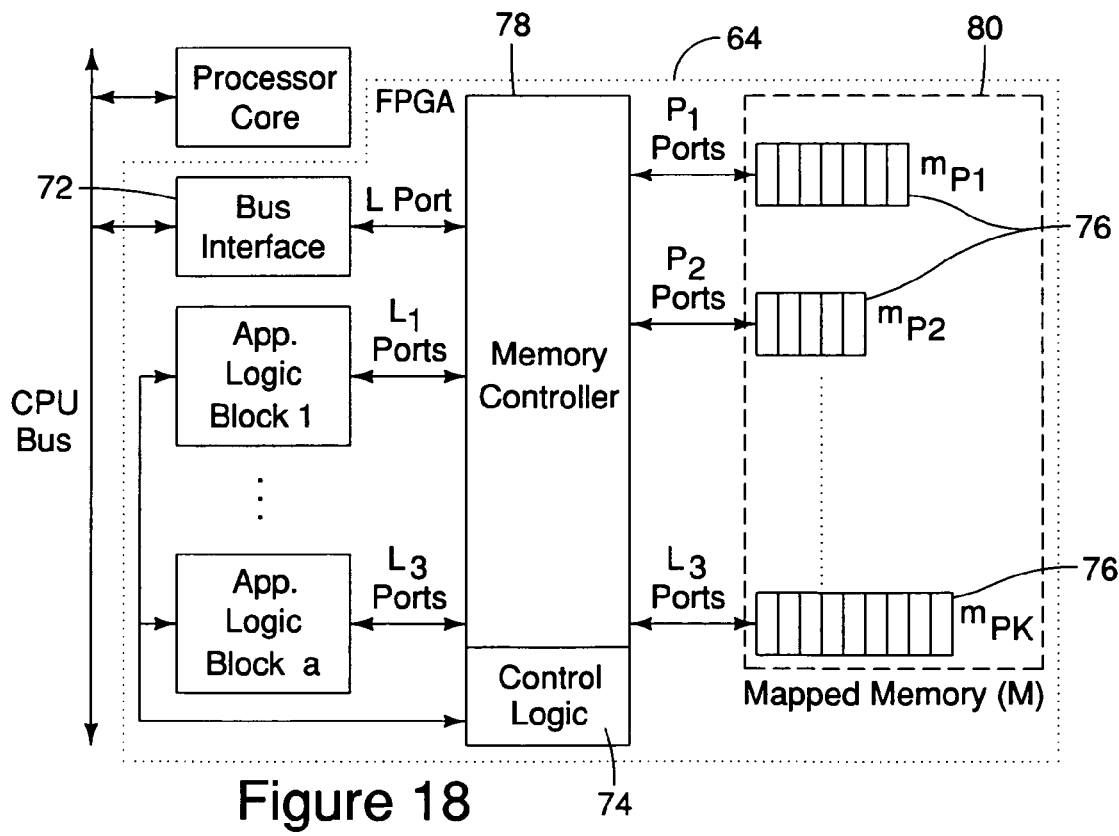
FIG. 18 is a block diagram of an architecture obtained after hardware interface synthesis.

An overview of the architecture of the FPGA 64 obtained after hardware interface synthesis is shown in FIG. 18. The bus interface 72 generated is specific to the bus protocol used. The control logic 74 contains memory mapped registers 76 that can be used to reset or start/stop execution of any of the application logic blocks through software. It also contains registers 76 reflecting the execution status and logic for interrupt generation, masking, for example. A memory controller 78 services all memory access requests for data residing in the mapped memory M. It is designed to give a higher priority to access requests by the application logic blocks. An access request by software is serviced only if a free port is currently available on the memory instance.

Figure 19:
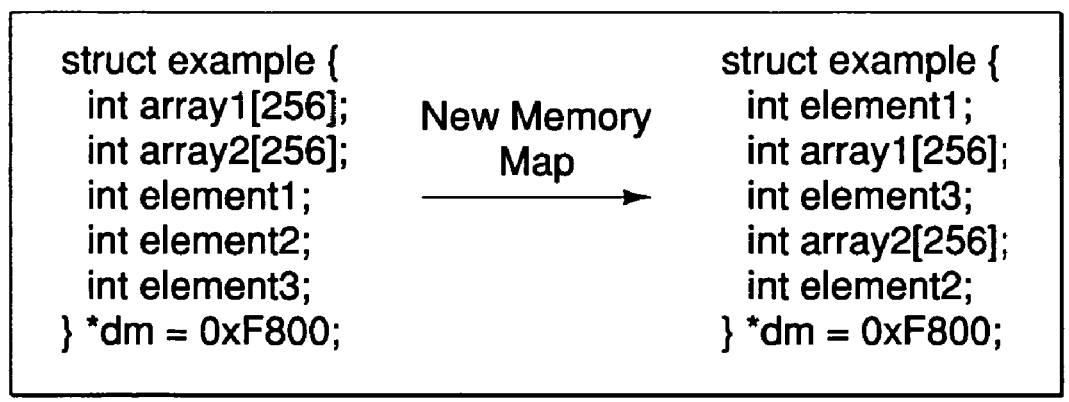
FIG. 19 illustrates modified address offsets in the software interface after memory mapping.

In the hardware interface shown in FIG. 18, the memory M uses a contiguous address space. Hence, data declarations in the software code have to be reordered so that they conform to the order in which they were mapped to this address space. The example in FIG. 19 illustrates this. Note that, when multiple arrays or data structures get sliced apart due to memory mapping, it is possible to perform address translations in the memory controller in order to abstract the memory architecture details from software.

The software can interface and share data with the hardware mapped to the FPGA 64 by either transferring all the data to the hardware, or they can use a shared memory, as explained below. In a shared memory based scheme, hardware and software can interface is through shared memory (i.e. M in FIG. 18 is shared). This can be done by using shared memory with no local storage or shared memory with local storage. In the scheme with no local storage, variables and data structures in the shared memory are declared such that the compiler does not apply any memory optimizations and uses processor registers minimally (for example, by declaring them as volatile in the C code). Other forms of local storage like processor caches are also bypassed when accessing the shared memory. Data to be processed by software is always read from the shared memory (in hardware) and the results are immediately written back (no caching). Due to its simplicity, this scheme can be used with any processor. In contrast, the shared memory with local storage scheme can only be used when the processor supports explicit instructions for flushing all local storage to memory. The advantage of both these schemes is the zero data transfer (communication) cost between software and hardware.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A method for performing high-level synthesis (HLS) of a digital design, comprising:
   a first phase for performing parallelizing transformations on an input behavioral description of the design captured in a top layer for a layered task graph model;
   a second phase for performing compiler and synthesis transformations dynamically on an intermediate representation of said input behavioral description;
   a third phase for implementing said transformed behavioral description using lower level primitives; and
   a fourth phase for generating implementation codes for the design.

2. The method as defined in claim 1, wherein said behavioral description is in a high-level language or a procedural language.

3. The method as defined in claim 1, further comprising synthesizing register-transfer level (RTL) description from said codes.

4. The method as defined in claim 1, wherein said intermediate representation includes a hierarchy of models representing elements of the design.

5. The method as defined in claim 1 wherein said first phase comprises a pre-synthesis phase that makes said compiler and synthesis transformations available in said second phase.

6. The method as defined in claim 5 wherein said pre-synthesis phase comprises speculative operations that enable movement of operations into conditionals.

7. The method as defined in claim 5, wherein said synthesis transformations include chaining operations across conditional blocks, scheduling on multi-cycle operations, and resource sharing, and said compiler transformations are applied dynamically during scheduling.

8. The method as defined in claim 7, wherein said scheduling is performed by a scheduling heuristic.

* * * * *

UNITED STATES PATENT AND TRADEMARK OFFICE
CERTIFICATE OF CORRECTION

PATENT NO. : 7,383,529 B2
APPLICATION NO. : 11/057416
DATED : June 3, 2008
INVENTOR(S) : Gupta et al.

It is certified that error appears in the above-identified patent and that said Letters Patent is hereby corrected as shown below:

In the Specification:

Col. 1   Lines 66, 67   Please delete "fragmentacross" and insert the words --fragment across-- in its place.

Col. 13   Line 13   Please delete "$\geqq$" and insert --$\geq$-- in its place.

Col. 15   Line 34   Please delete "anothercode" and insert the words --another code-- in its place.

Col. 17   Line 52   After "1:", please delete "f irst" and insert --first-- in its place.

Col. 17   Line 53   After "2:", please delete "stepToSh f t" and insert --stepToShift-- in its place.

Col. 17   Line 54   Please delete "3: BB(stepToShi f t)←BB(stepToShi f t) - stepToShi f t" and insert --3: BB(stepToShift)←BB(stepToShift) – stepToShift-- in its place.

Col. 17   Line 56   After "last BB U", please delete "stepToShi f t" and insert --stepToShift-- in its place.

Col. 17   Line 58   After "U", please delete "Copy(stepToShi f t)" and insert --Copy(stepToShift)-- in its place.

UNITED STATES PATENT AND TRADEMARK OFFICE
CERTIFICATE OF CORRECTION

PATENT NO.         : 7,383,529 B2
APPLICATION NO. : 11/057416
DATED              : June 3, 2008
INVENTOR(S)        : Gupta et al.

It is certified that error appears in the above-identified patent and that said Letters Patent is hereby corrected as shown below:

Col. 18    Line 20    Please delete "if (stepToShi f t" and insert
                      --if stepToShift-- in its place.

Col. 20    Line 16    In item 6:, please delete "insuffi cient" and insert
                      --insufficient-- in its place.

Signed and Sealed this

Second Day of June, 2009

JOHN DOLL
*Acting Director of the United States Patent and Trademark Office*